United States Patent
Basker et al.

(10) Patent No.: US 8,513,073 B1
(45) Date of Patent: Aug. 20, 2013

(54) SILICON GERMANIUM CHANNEL WITH SILICON BUFFER REGIONS FOR FIN FIELD EFFECT TRANSISTOR DEVICE

(75) Inventors: Veeraraghavan S. Basker, Schenectady, NY (US); Tenko Yamashita, Schenectady, NY (US); Chun-Chun Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/600,625

(22) Filed: Aug. 31, 2012

Related U.S. Application Data

(63) Continuation of application No. 13/595,477, filed on Aug. 27, 2012.

(51) Int. Cl.
*H01L 21/336* (2006.01)

(52) U.S. Cl.
USPC .......................... 438/197; 438/285

(58) Field of Classification Search
None
See application file for complete search history.

(56) References Cited

U.S. PATENT DOCUMENTS

| | | | |
|---|---|---|---|
| 6,885,055 B2 | 4/2005 | Lee | |
| 7,348,225 B2 | 3/2008 | Zhu | |
| 7,508,031 B2 | 3/2009 | Liu et al. | |
| 8,106,459 B2 | 1/2012 | Chang et al. | |
| 2007/0241399 A1* | 10/2007 | Irisawa et al. | 257/347 |
| 2008/0001171 A1* | 1/2008 | Tezuka et al. | 257/191 |
| 2008/0135886 A1* | 6/2008 | Irisawa et al. | 257/255 |
| 2010/0219480 A1* | 9/2010 | Tezuka et al. | 257/369 |
| 2011/0024804 A1* | 2/2011 | Chang et al. | 257/288 |
| 2011/0147805 A1* | 6/2011 | Irisawa et al. | 257/255 |
| 2011/0180847 A1 | 7/2011 | Ikeda et al. | |
| 2011/0193178 A1 | 8/2011 | Chang et al. | |
| 2012/0025313 A1 | 2/2012 | Chang et al. | |
| 2012/0280211 A1* | 11/2012 | Cohen et al. | 257/24 |
| 2012/0319211 A1* | 12/2012 | van Dal et al. | 257/401 |

OTHER PUBLICATIONS

Chaudhuri, Sourinda et al., "Accurate Leakage Estimation for FinFET Standard Cells USing the Response Surface Methodology", 2012 25th International Conference on VLSI Design, IEEE Computer Society; Jan. 7-11, 2012; pp. 238-244.

Lin, Chung-Hsun et al., "Modeling of Width-Quantization-Induced Variations in Logic FinFETs for 22nm and Beyond", 2011 Symposium on VLSI Technology Digest of Technical Papers; Jun. 14-16, 2011; pp. 16-17.

Yamashita, T. et al., "Sub-25nm FinFET with Advanced Fin Formation and Short Channel Effect Engineering", 2011 Symposium on VLSI Technology Digest of Technical Papers; Jun. 14-16, 2011; pp. 14-15.

* cited by examiner

*Primary Examiner* — Scott B Geyer
(74) *Attorney, Agent, or Firm* — Cantor Colburn LLP; Vazken Alexanian

(57) ABSTRACT

A method of forming a fin field effect transistor (finFET) device includes forming a silicon fin on a substrate; forming an inner spacer adjacent to a first portion of the silicon fin; forming silicon germanium regions adjacent to a second portion of the silicon fin and the inner spacer; and oxidizing the silicon germanium regions, such that the second portion of the silicon fin that is located adjacent to the silicon germanium regions is converted to a silicon germanium channel region during oxidizing of the silicon germanium regions, and such that the first portion of the silicon fin is protected by the inner spacer during oxidation of the silicon germanium regions, wherein the first portion of the silicon fin comprises a silicon buffer region located between the silicon germanium channel region and a source/drain region of the finFET device.

14 Claims, 33 Drawing Sheets

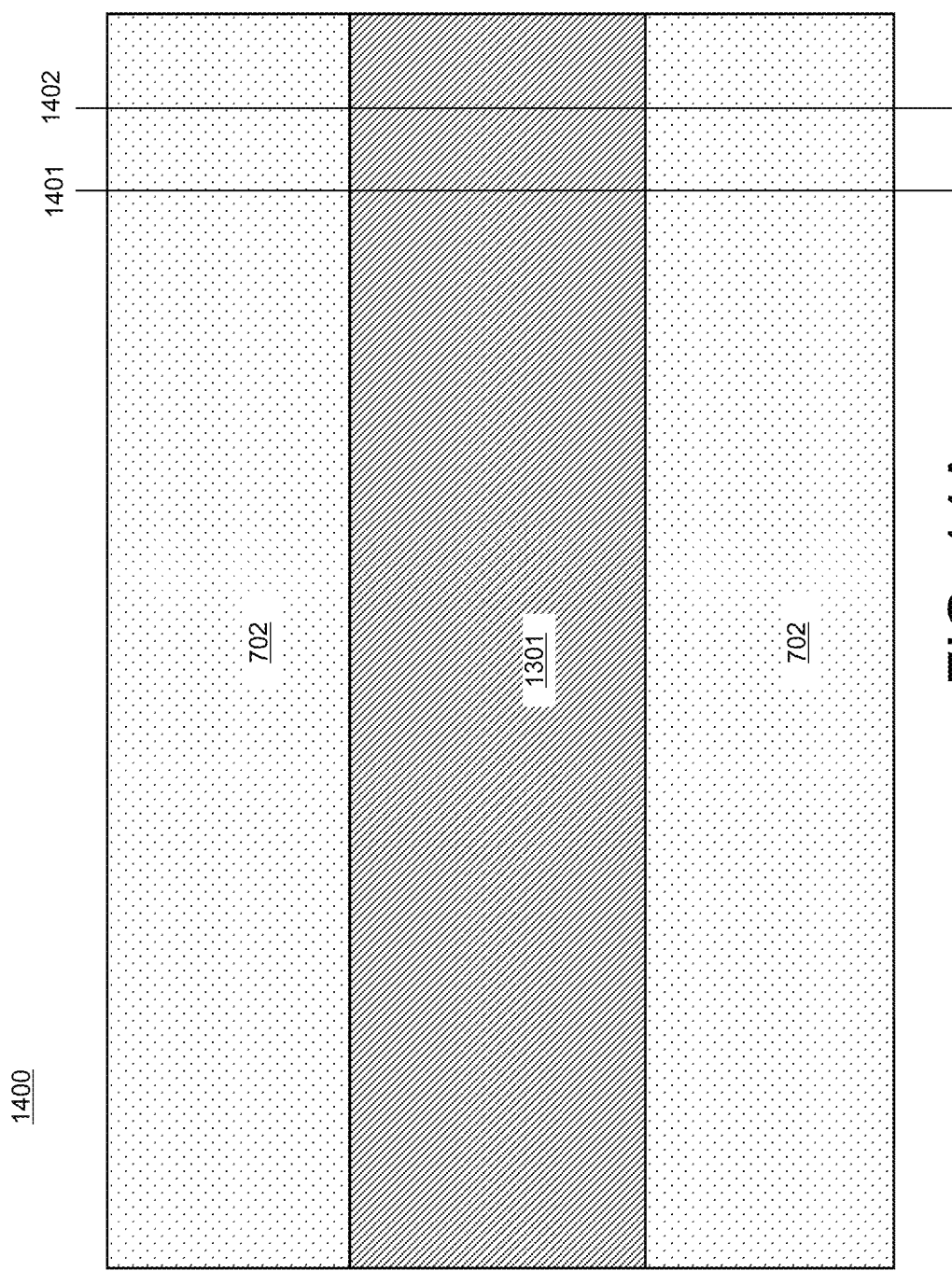

SILICON GERMANIUM CHANNEL WITH SILICON BUFFER REGIONS FOR FIN FIELD EFFECT TRANSISTOR DEVICE

CROSS-REFERENCE TO RELATED APPLICATION

The present application is a continuation of and claims priority from U.S. patent application Ser. No. 13/595,477, filed on Aug. 27, 2012 the entire contents of which are incorporated herein by reference.

BACKGROUND

This disclosure relates generally to semiconductor device fabrication, and more particularly to fabrication of fin field effect transistor (finFET) devices.

Due to their relatively fast switching times and high current densities, finFET devices are a desired semiconductor device architecture. In its basic form, a finFET device includes a source, a drain, and one or more fin-shaped channels located between the source and drain. A gate electrode over the fin(s) regulates electron flow between the source and the drain. The architecture of a finFET device, however, may present notable fabrication challenges.

BRIEF SUMMARY

In one aspect, a method of forming a fin field effect transistor (finFET) device includes forming a silicon fin on a substrate; forming an inner spacer adjacent to a first portion of the silicon fin; forming silicon germanium regions adjacent to a second portion of the silicon fin and the inner spacer; and oxidizing the silicon germanium regions, such that the second portion of the silicon fin that is located adjacent to the silicon germanium regions is converted to a silicon germanium channel region during oxidizing of the silicon germanium regions, and such that the first portion of the silicon fin is protected by the inner spacer during oxidation of the silicon germanium regions, wherein the first portion of the silicon fin comprises a silicon buffer region located between the silicon germanium channel region and a source/drain region of the finFET device.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGs:

FIG. 14A illustrates a top view of the device of FIG. 13A after removal of the oxide fill to expose the source/drain regions.

DETAILED DESCRIPTION

Embodiments of a method of forming a silicon germanium (SiGe) channel with silicon (Si) buffer regions for a finFET device, and of a finFET device including a SiGe channel with silicon buffer regions, are provided, with exemplary embodiments being discussed below in detail. A SiGe channel provides a workfunction shift in p-type finFET devices. However, because there is a relatively small valence band offset for holes, the off-state leakage current may be increased in SiGe channel finFET device, resulting in increased power consumption for the finFET device. Therefore, the SiGe channel region of the finFET may be separated from the silicon source/drain regions by silicon buffer regions in the fin; these silicon buffer regions may act to suppress excess leakage current. The silicon buffer regions are formed using an inner spacer that covers portions of the fins that are located adjacent to the source/drain regions during formation of the SiGe channel regions in the fins.

Figure 1:
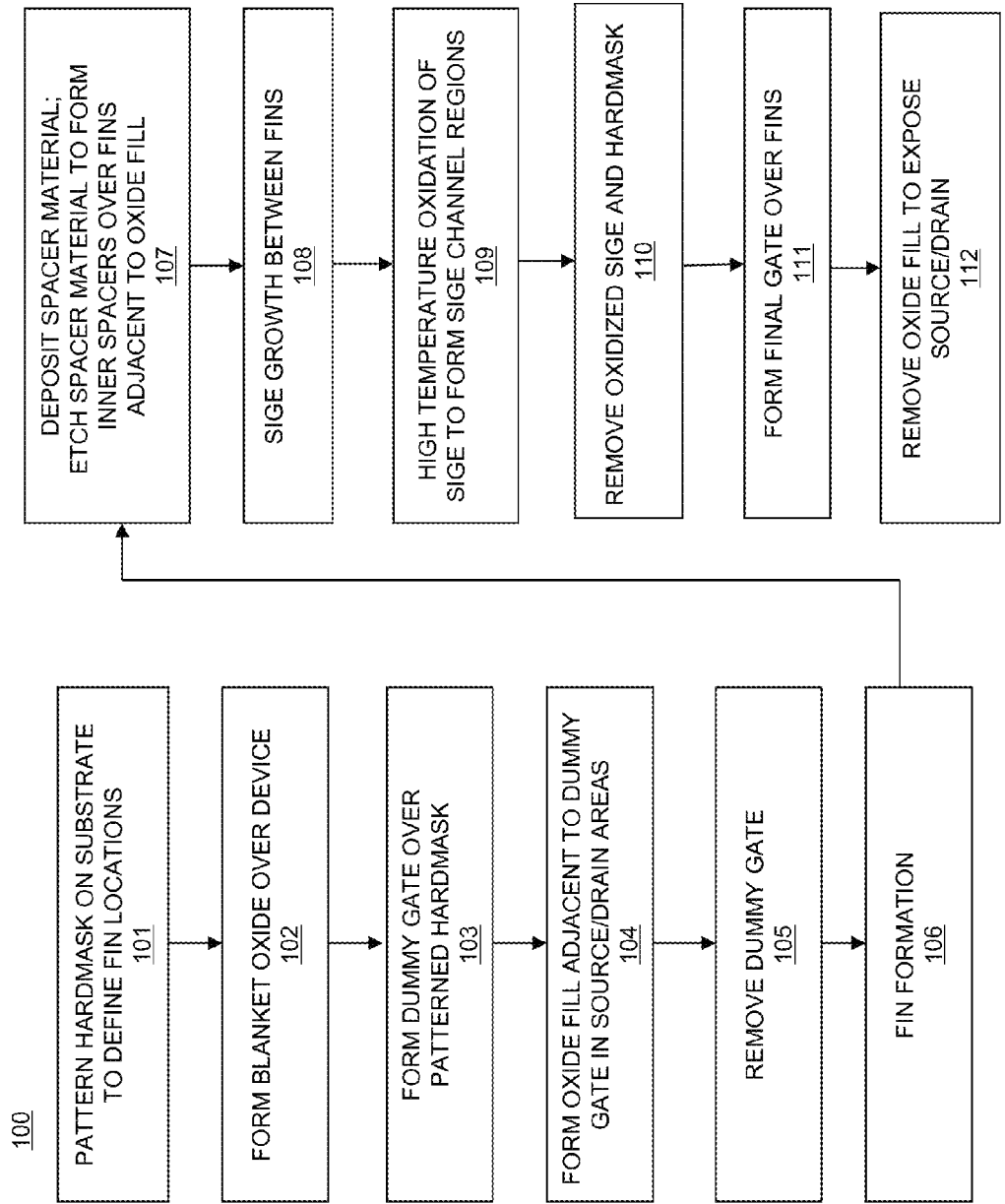
FIG. 1 is a flowchart illustrating an embodiment of a method of forming a silicon germanium channel with silicon buffer regions for a finFET device.
Figure 2A:
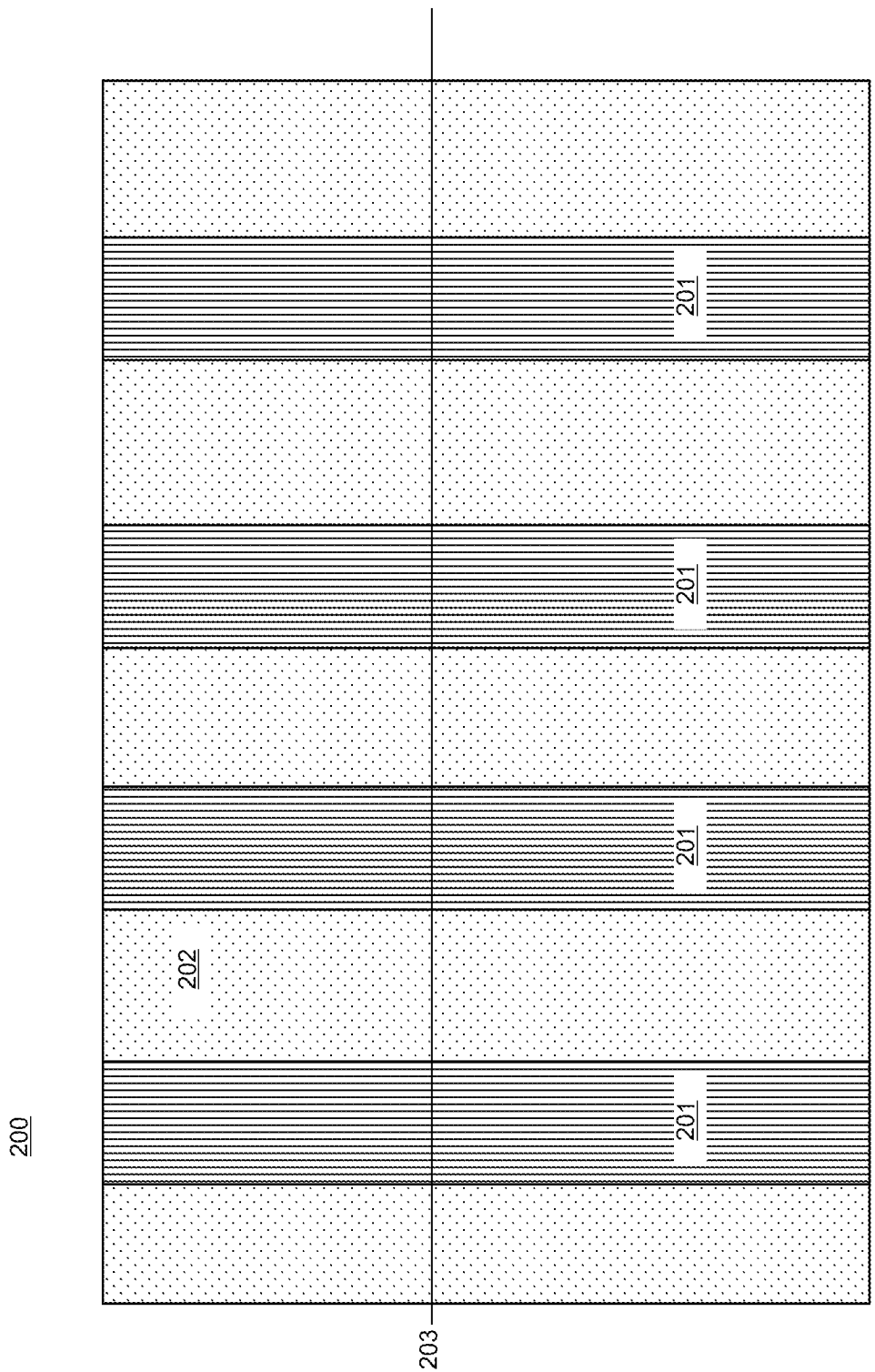
FIG. 2A illustrates a top view of a device including a patterned hardmask on a substrate.
Figure 2B:
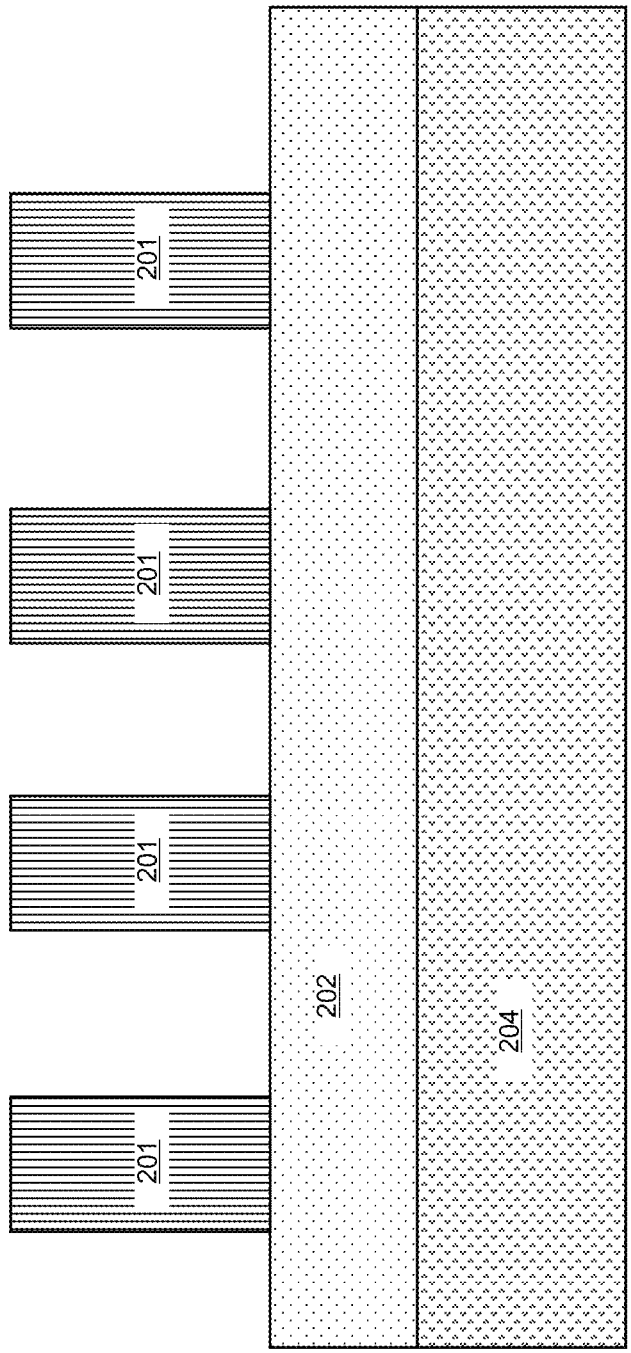
FIG. 2B illustrates a cross sectional view of a device including a patterned hardmask on a substrate.

FIG. 1 is a flowchart illustrating an embodiment of a method 100 of forming a silicon germanium channel with silicon buffer regions for a finFET device. Method 100 of FIG. 1 comprises a replacement gate finFET fabrication process. First, in block 101 of FIG. 1, a substrate is provided, and a hardmask is patterned on the top surface of the substrate to define the locations of the fins. The substrate may comprise a silicon-on-insulator (SOI) substrate, including a top silicon layer on top of a buried oxide (BOX) layer, in some embodiments. In other embodiments, the substrate may comprise bulk silicon. The top silicon layer may include shallow trench isolation (STI) regions; these STI regions may be located in any appropriate location in the top silicon layer. The hardmask may comprise oxide, and the hardmask may be formed on the substrate and then patterned to define the fin locations in any appropriate manner. FIG. 2A illustrates a top view of a device 200 including a patterned hardmask on a substrate, and FIG. 2B illustrates a cross section of the device 200 along line 203 that is shown in FIG. 2A. Device 200 includes patterned hardmask 201 on top of a SOI substrate comprising top silicon layer 202 on top of BOX 204. Hardmask 201 may comprise oxide. Top silicon layer 202 may include STI regions (not shown); the STI regions may have any appropriate location and configuration in top silicon layer 202.

Figure 3A:
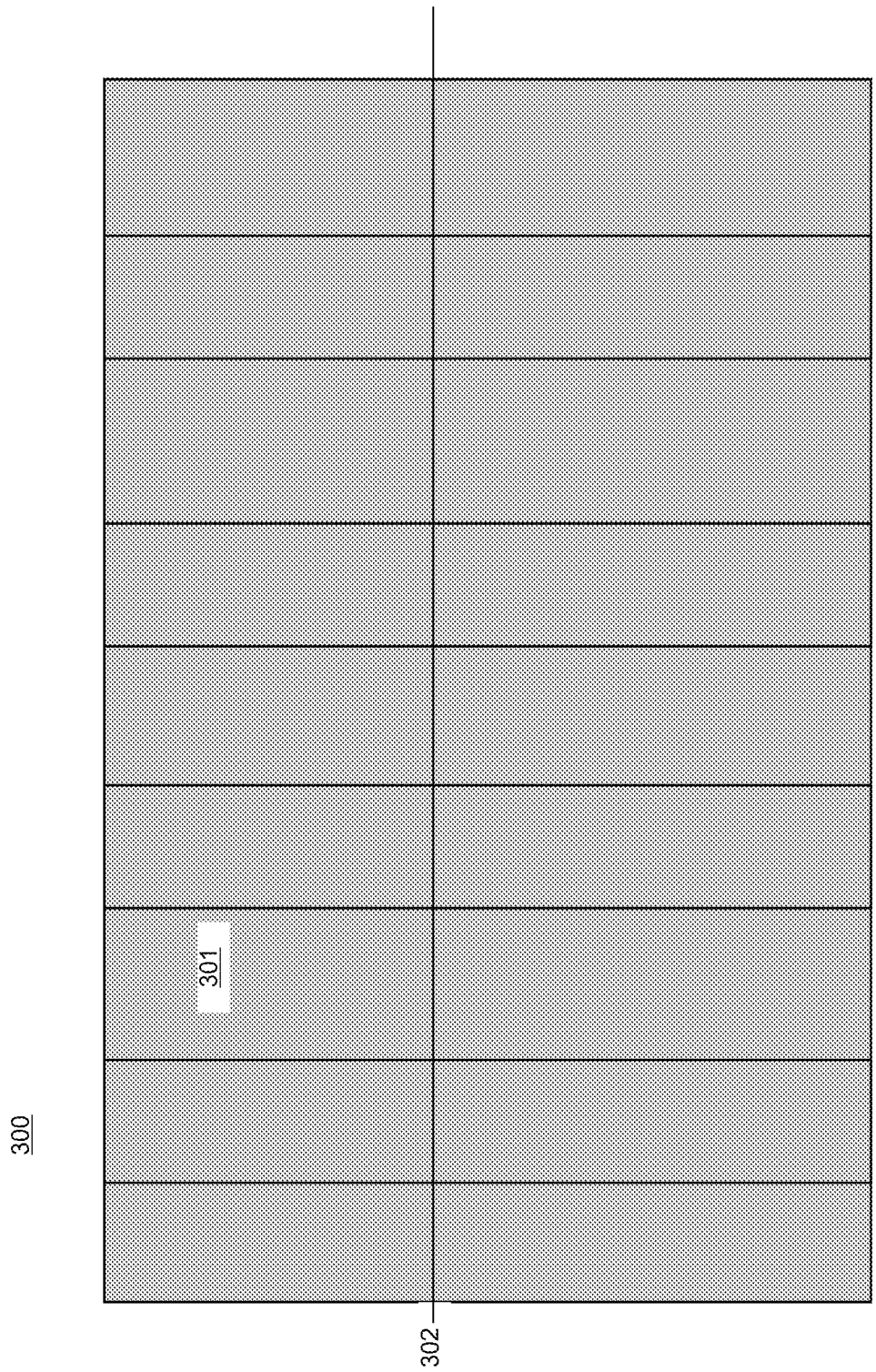
FIG. 3A illustrates a top view of the device of FIG. 2A after formation of blanket oxide over the device.
Figure 3B:
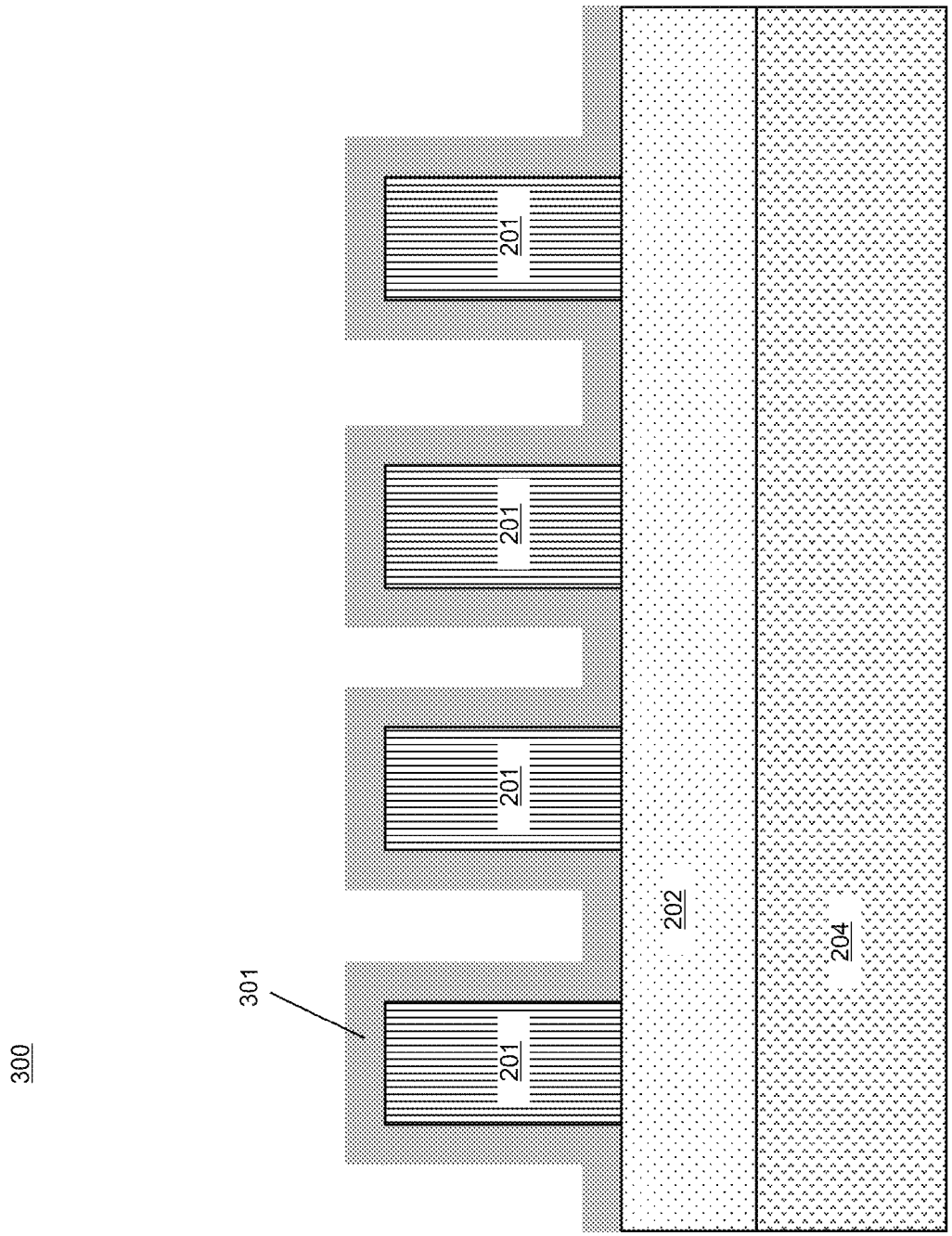
FIG. 3B illustrates a cross sectional view of the device of FIG. 2B after formation of blanket oxide over the device.

Returning to method 100, next, in block 102, a blanket oxide layer is formed over the top of device, over the patterned hardmask and the top silicon layer. The blanket oxide layer protects the top silicon layer of the substrate during subsequent processing steps that are performed during method 100. The blanket oxide may be formed in any appropriate manner. FIG. 3A illustrates a top view of the device 200 of FIG. 2A after formation of blanket oxide 301, and FIG. 3B illustrates a cross section of the device 300 of FIG. 3A along line 302 that is shown in FIG. 3A. Blanket oxide 301 covers patterned hardmask 201 and top silicon layer 202.

Figure 4A:
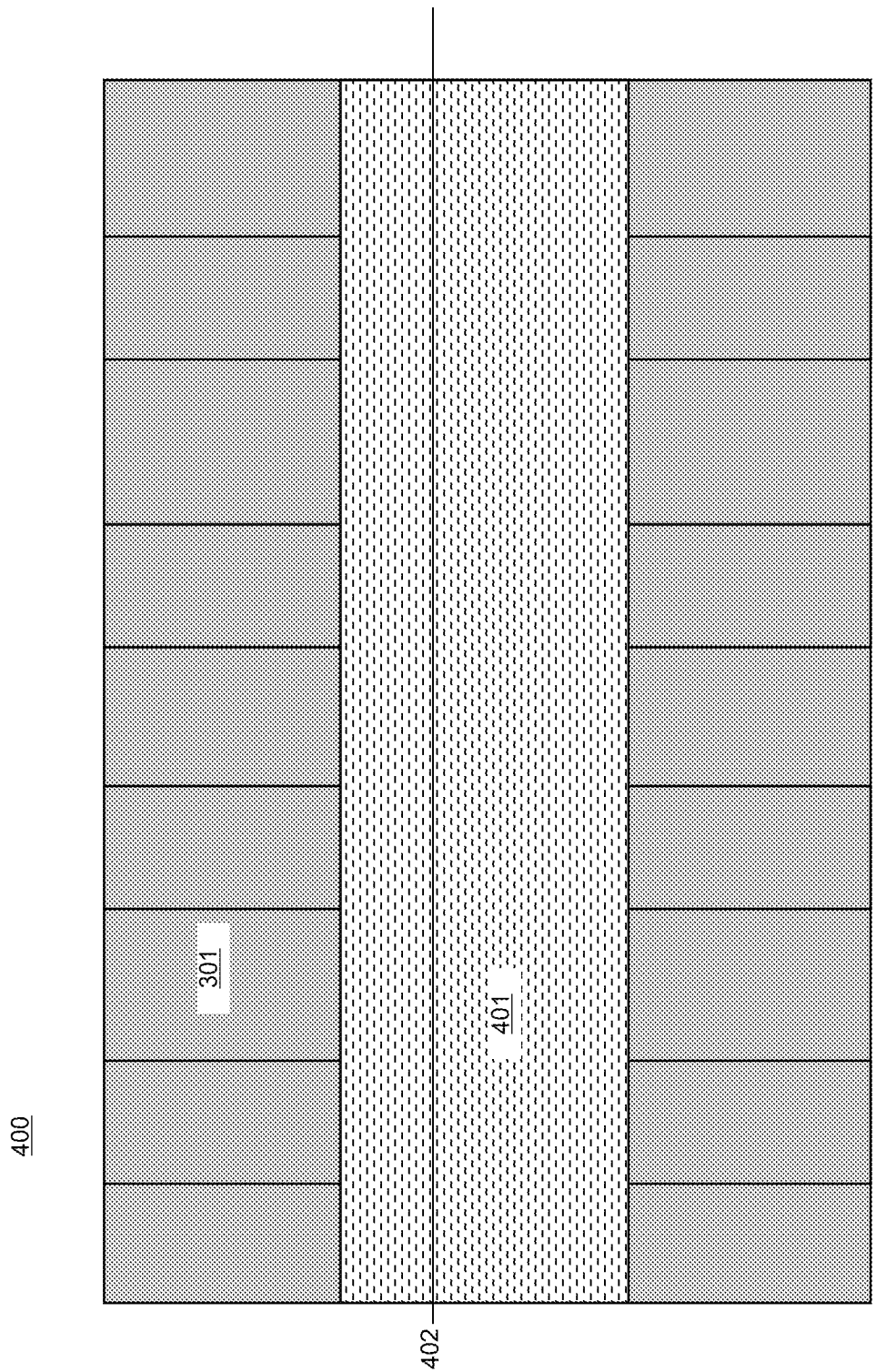
FIG. 4A illustrates a top view of the device of FIG. 3A after formation of a dummy gate.
Figure 4B:
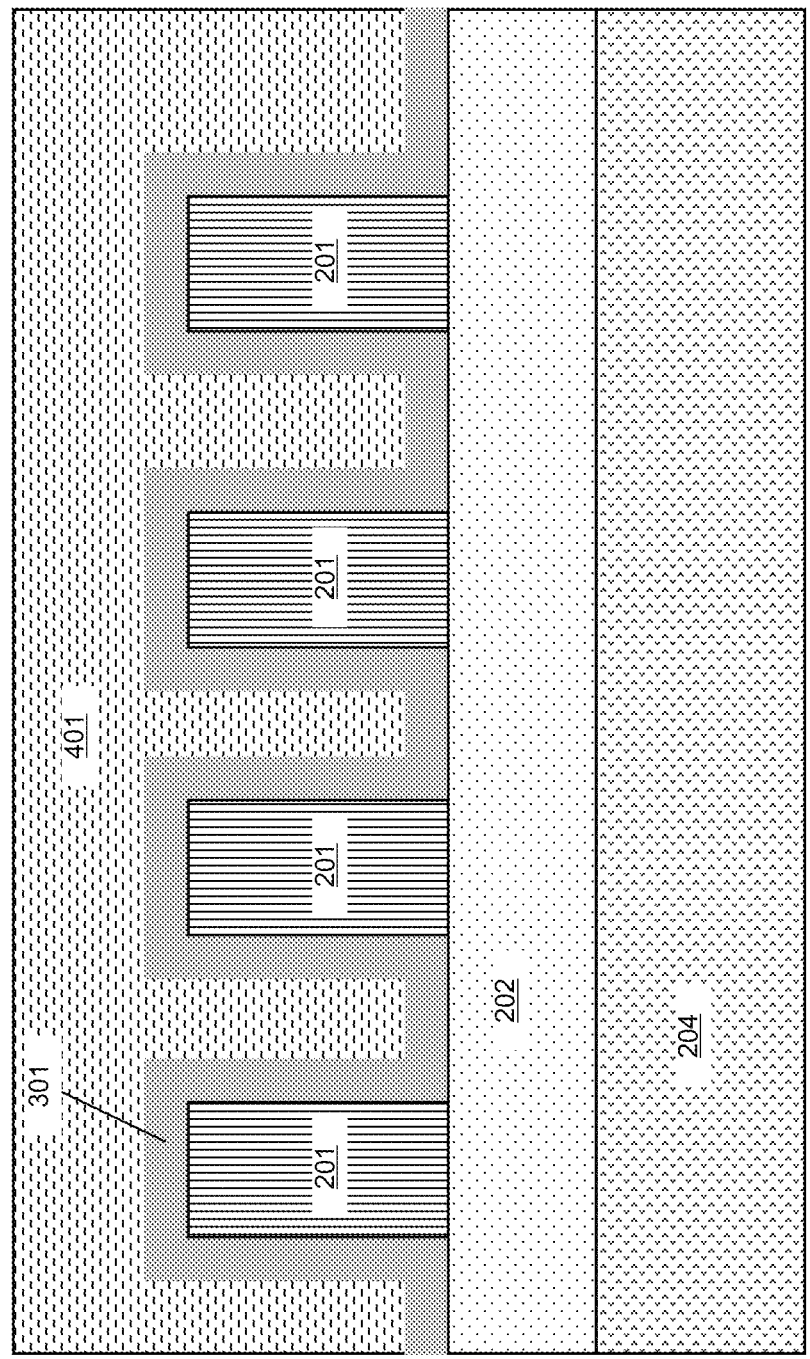
FIG. 4B illustrates a cross sectional view of the device of FIG. 3B after formation of a dummy gate.

Next, method 100 proceeds to block 103, in which a dummy gate is formed over the device. The dummy gate may comprise any appropriate material, including but not limited to polysilicon. The location of the dummy gate defines the locations of channel regions. The dummy gate may be formed on top of the blanket oxide in any appropriate manner. FIG. 4A illustrates a top view of the device 300 of FIG. 3A after formation of dummy gate 401, and FIG. 4B illustrates a cross section of the device 400 of FIG. 4A along line 402 that is shown in FIG. 4A. Dummy gate 401 is located over the areas of top silicon layer 202 that will become channel regions in the finished finFET device. The dummy gate 401 may comprise polysilicon in some embodiments, and is located on top of the blanket oxide 301.

Figure 5A:
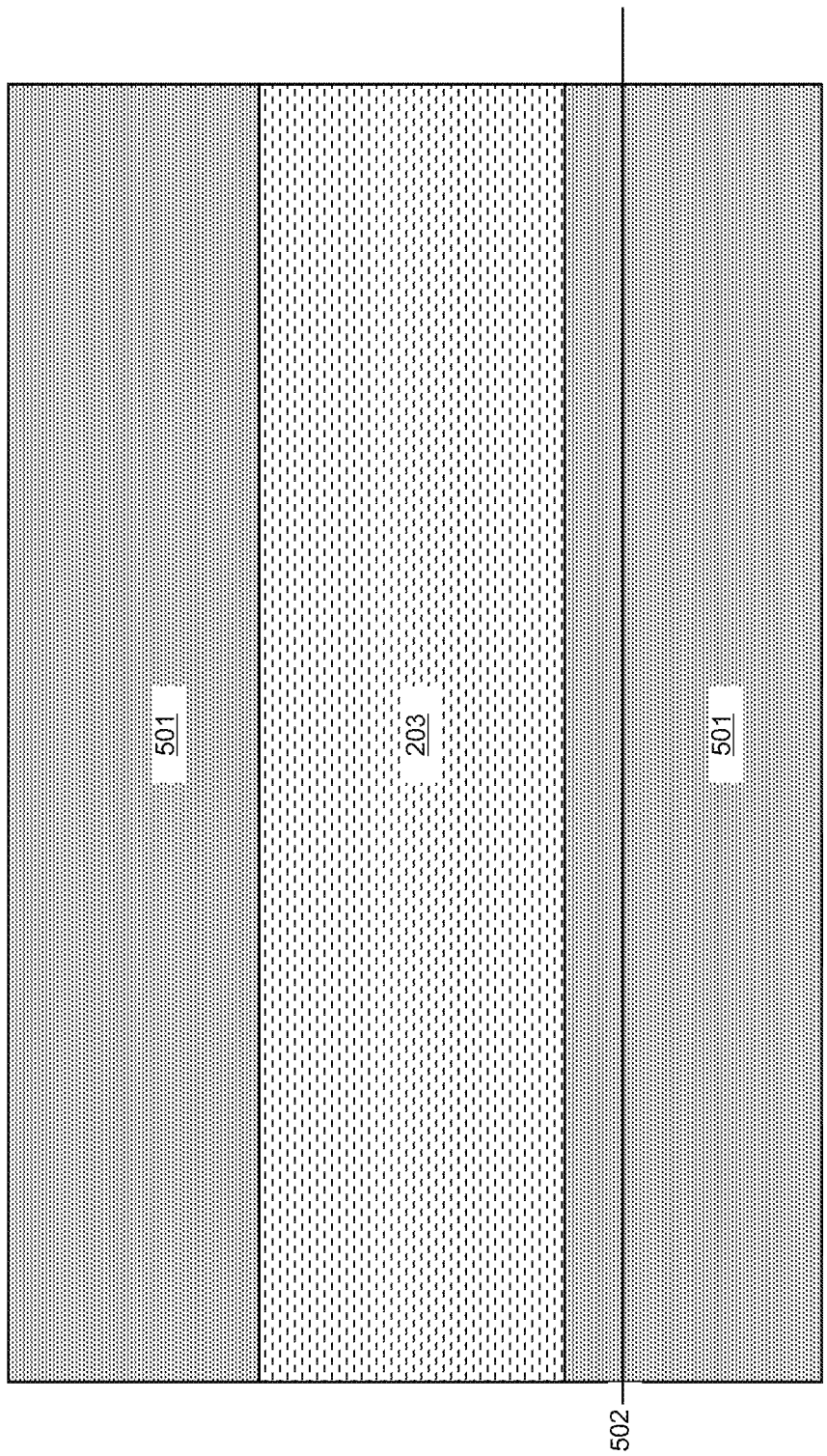
FIG. 5A illustrates a top view of the device of FIG. 4A after formation of an oxide fill adjacent to the dummy gate.
Figure 5B:
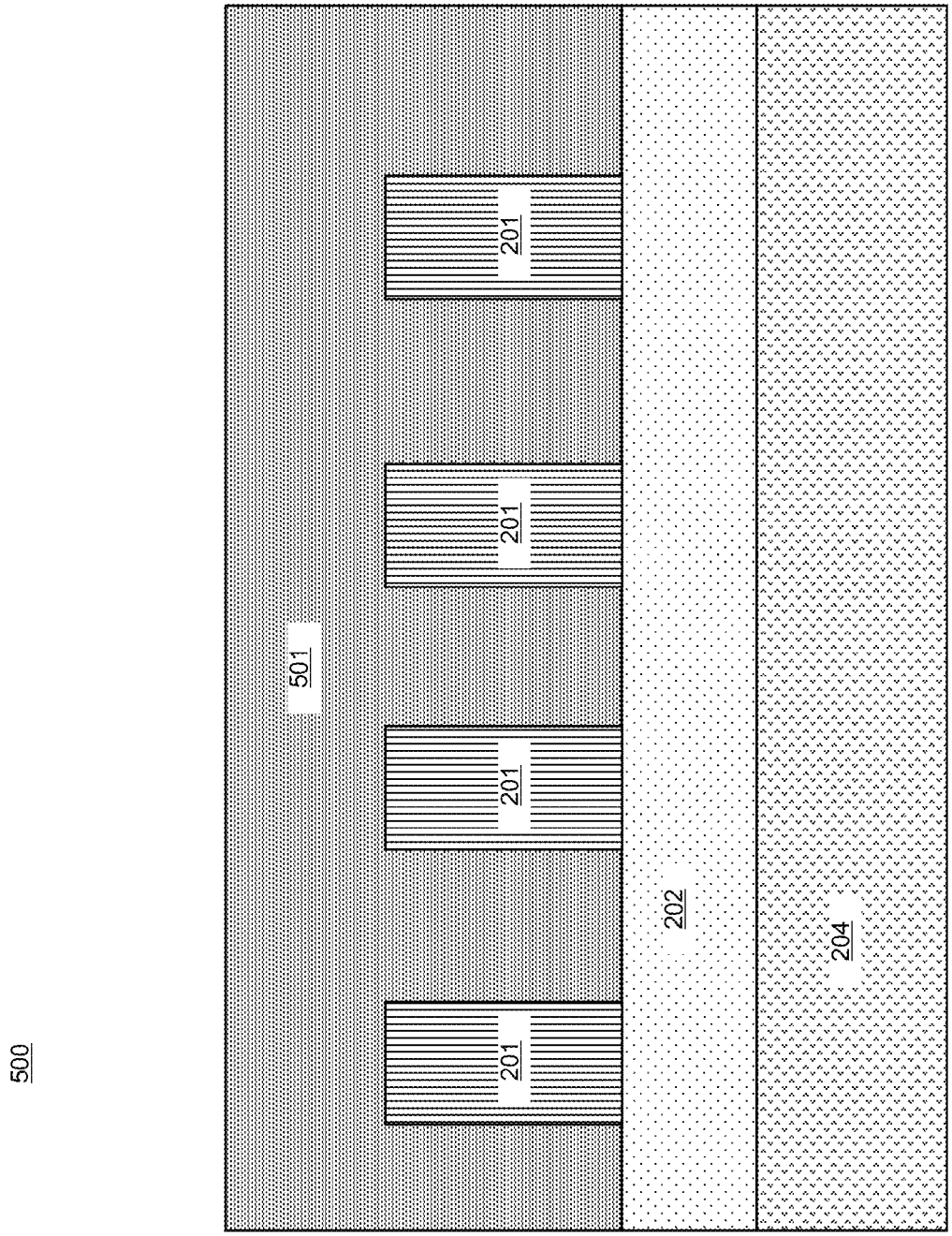
FIG. 5B illustrates a cross section of the device of FIG. 4B after formation of an oxide fill adjacent to the dummy gate.

Next, method 100 proceeds to block 104, in which oxide fill is formed over the device adjacent to the dummy gate. The location if the oxide fill defines the locations of source/drain regions. The oxide fill may be formed on top of the blanket oxide in any appropriate manner. FIG. 5A illustrates a top view of the device 400 of FIG. 4A after formation of oxide fill 501, and FIG. 5B illustrates a cross section of the device 500 of FIG. 5A along line 502 that is shown in FIG. 5A. Oxide fill 501 is located over the areas of top silicon layer 202 that will become source/drain regions in the finished finFET device. The oxide fill 501 is located on top of the blanket oxide 301.

Figure 6A:
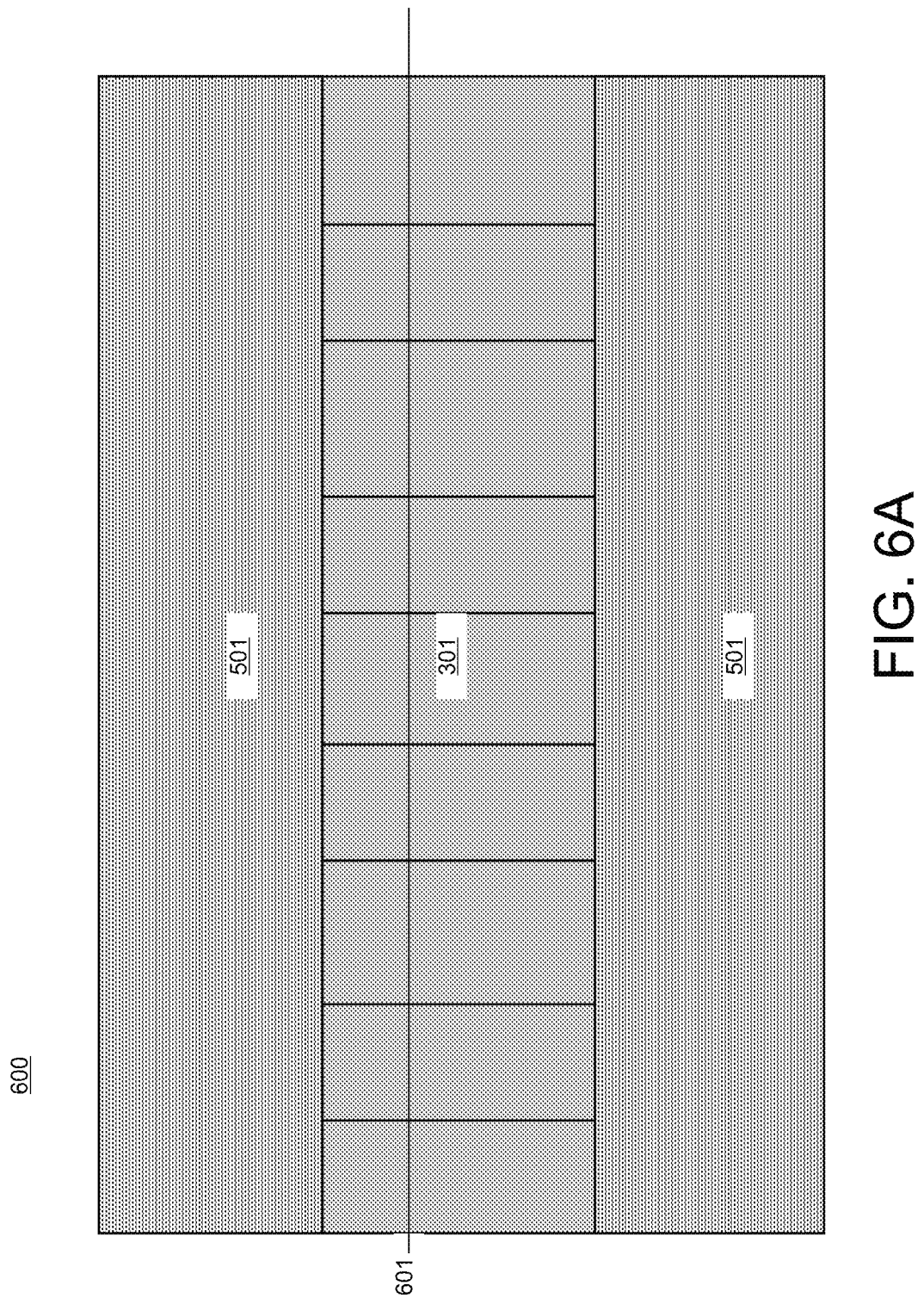
FIG. 6A illustrates a top view of the device of FIG. 5A after removal of the dummy gate.
Figure 6B:
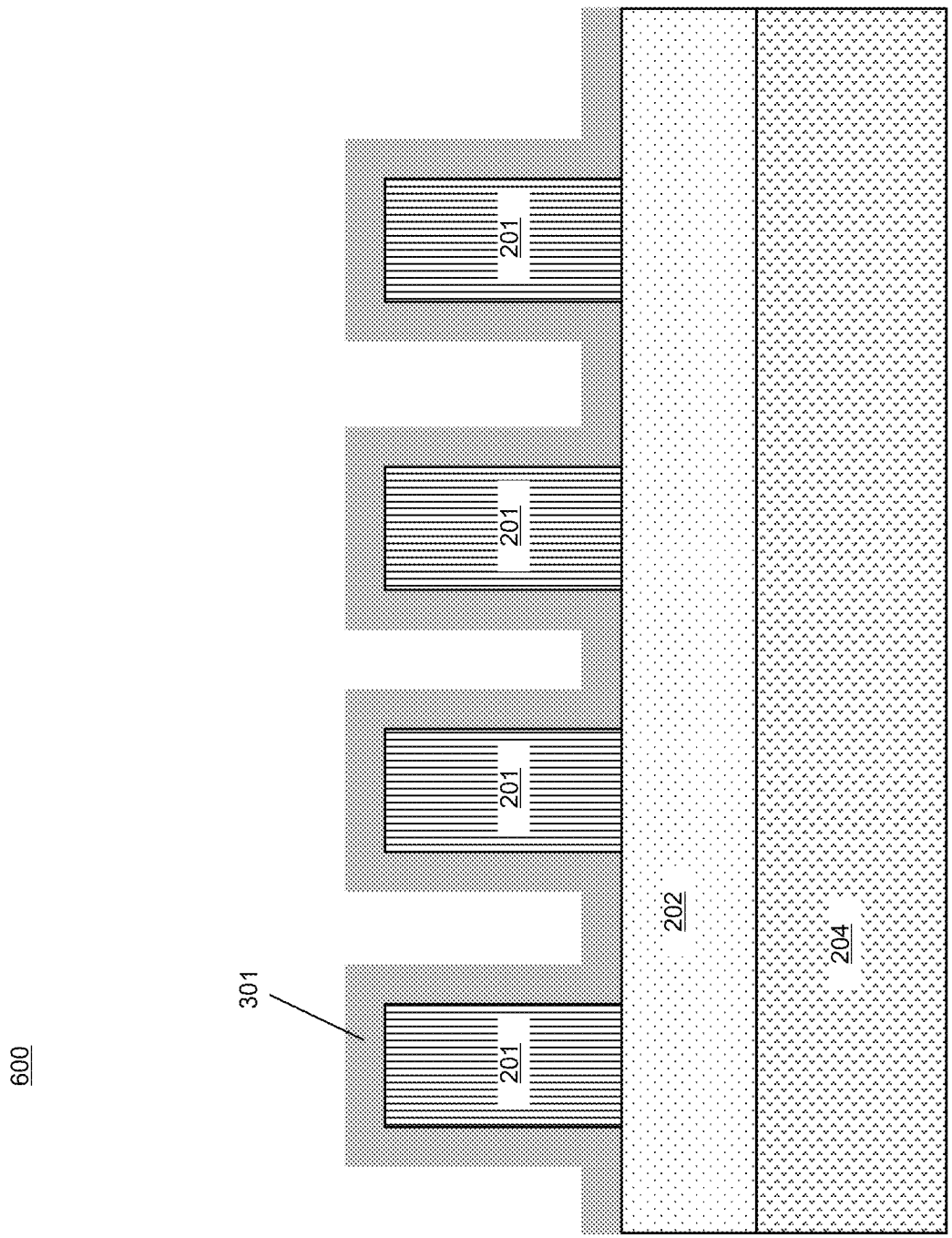
FIG. 6B illustrates a cross sectional view of the device of FIG. 5B after removal of the dummy gate.

Then, in block 105 of method 100, the dummy gate is removed. The dummy gate may be removed in any appropriate manner. Removal of the dummy gate is performed to expose the portions of the top silicon layer that will be channel regions for the finFET device for processing. FIG. 6A illustrates a top view of the device 500 of FIG. 5A after removal of dummy gate 401, and FIG. 6B illustrates a cross section of the device 600 of FIG. 6A along line 601 that is shown in FIG. 6A. Removal of the dummy gate 401 exposes the blanket oxide 301, which is located on top of the patterned hardmask 201 and top silicon layer 202.

Figure 7A:
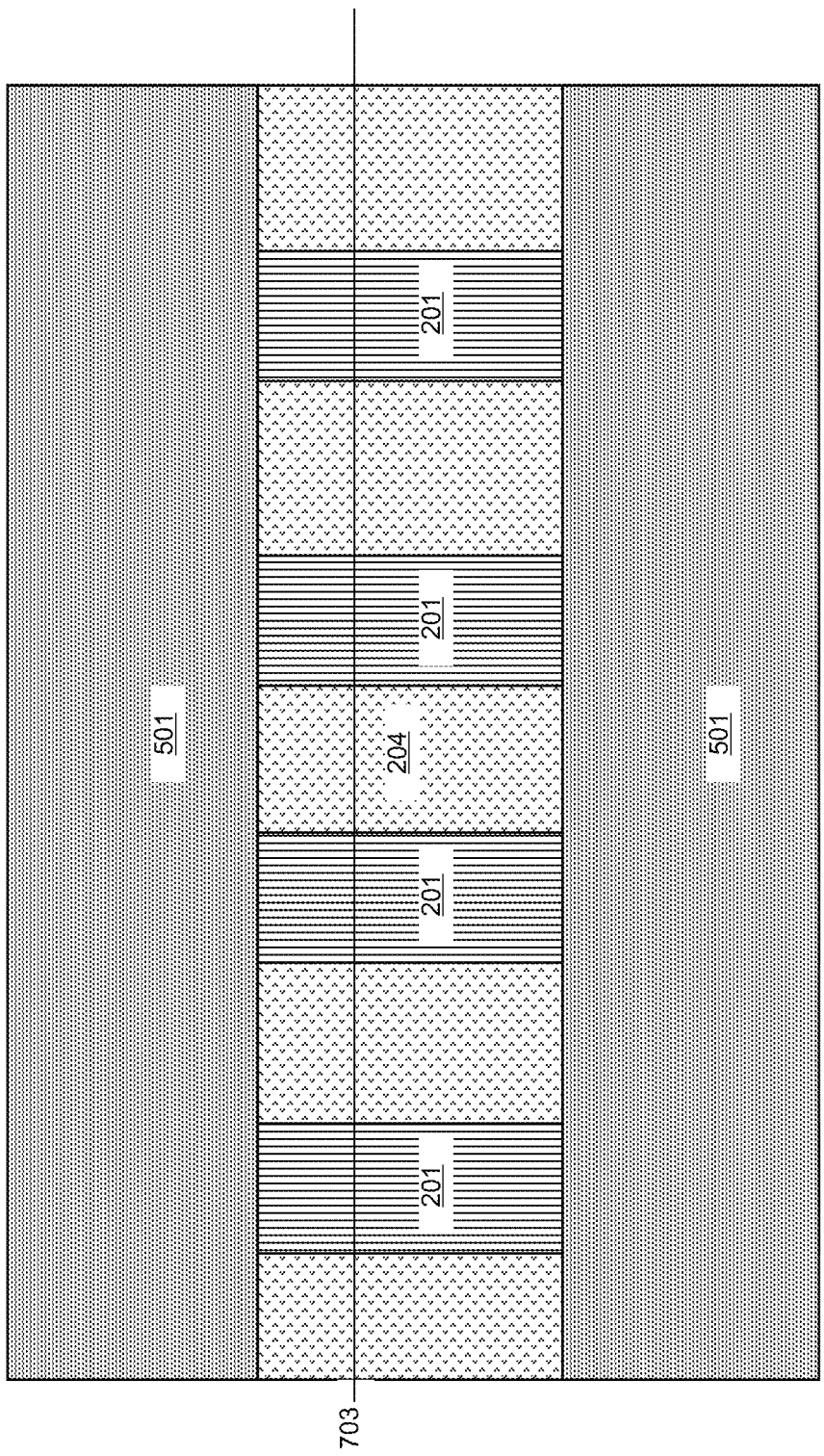
FIG. 7A illustrates a top view of the device of FIG. 6A after fin formation.
Figure 7B:
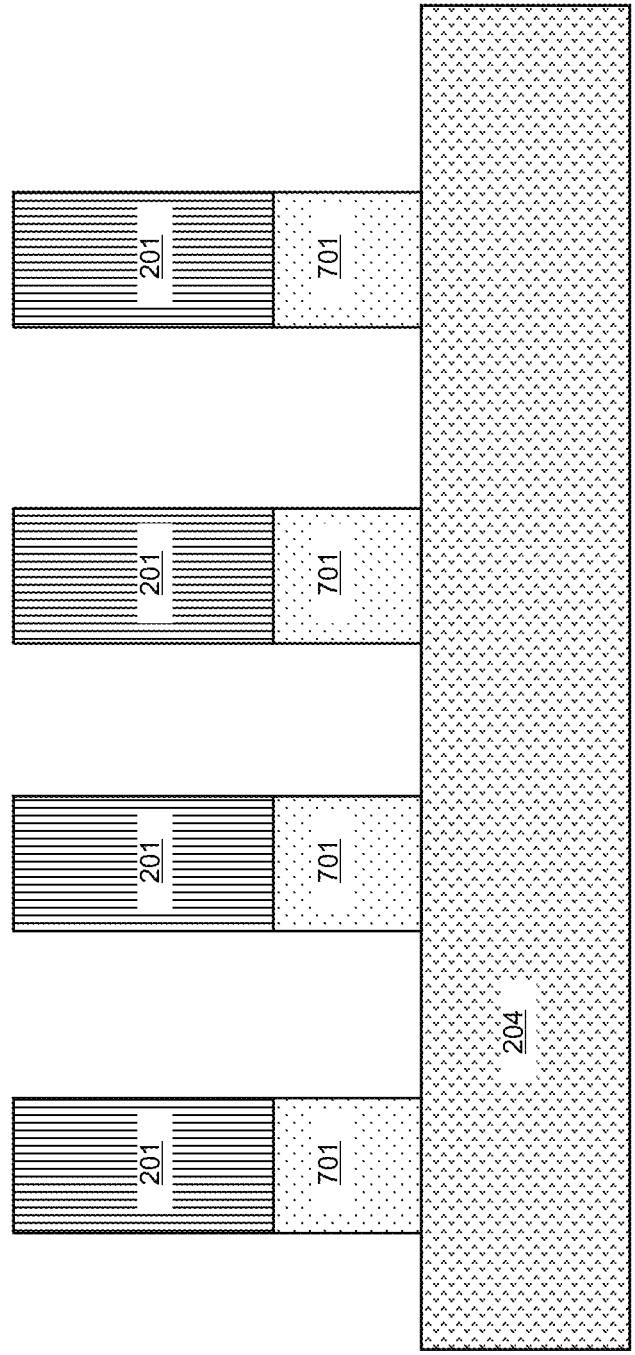
FIG. 7B illustrates a cross sectional view of the device of FIG. 6B after fin formation.

Returning to FIG. 1, next, in block 106, fins are formed in the top silicon layer of the substrate in the area from which the dummy gate was removed during block 105 of FIG. 1. The fins are formed by etching the top silicon layer of the substrate using the patterned hardmask as a mask. The fins are located underneath the patterned hardmask after the fin formation etch, while the exposed portions of the top silicon layer that are not located under the patterned hardmask are removed. The fin formation etch may comprise reactive ion etching (RIE), and may include an initial breakthrough step to remove the blanket oxide before etching the top silicon layer to form the fins. The fins that are formed during block 106 of FIG. 1 comprise silicon. The portions of the top silicon layer that are protected by the oxide fill during the fin formation etch comprise source/drain regions for the finished finFET device. FIG. 7A illustrates a top view of the device 600 of FIG. 6A after formation of fins 701 in the top silicon layer 202, and FIG. 7B illustrates a cross section of the device 700 of FIG. 7A along line 703 that is shown in FIG. 7A. The portion of the blanket oxide 301 that exposed by the removal of the dummy gate 401 is removed by the initial breakthrough stage of the fin formation etch, and then the fin formation etch then proceeds to remove the portions of the top silicon layer 202 that were not located underneath patterned hardmask 201, leaving fins 701 on BOX 204. Fins 701 comprise silicon, and are located underneath the patterned hardmask 201. The BOX 204 is exposed in between the fins 701. The portions of top silicon layer 202 that are located underneath oxide fill 501 are not etched during the fin formation etch that is performed in block 106, and comprise source/drain regions for the finFET device that are henceforth referred to as source/drain regions 702.

Figure 8A:
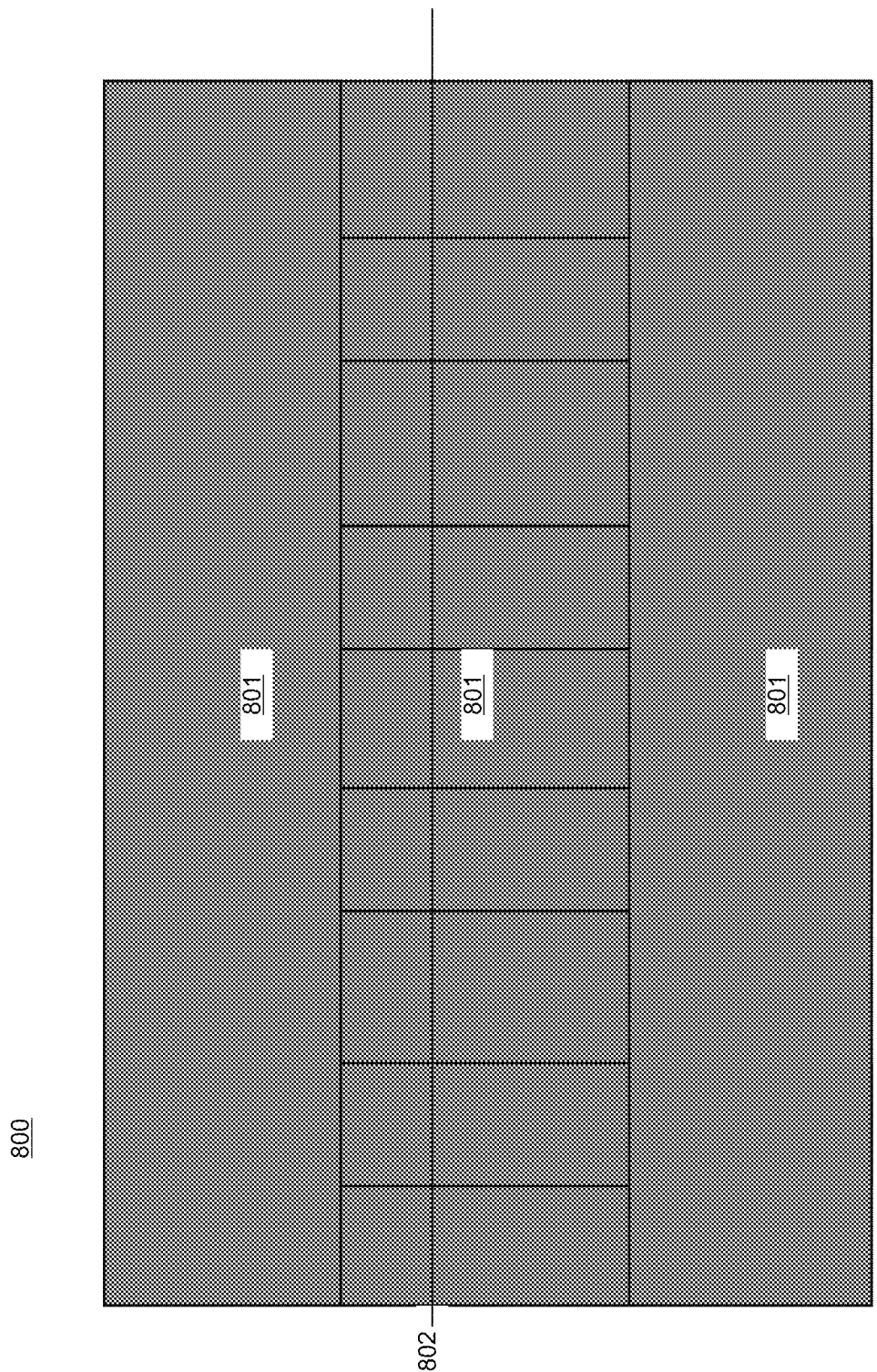
FIG. 8A illustrates a top view of the device of FIG. 7A after deposition of spacer material over the device.
Figure 8B:
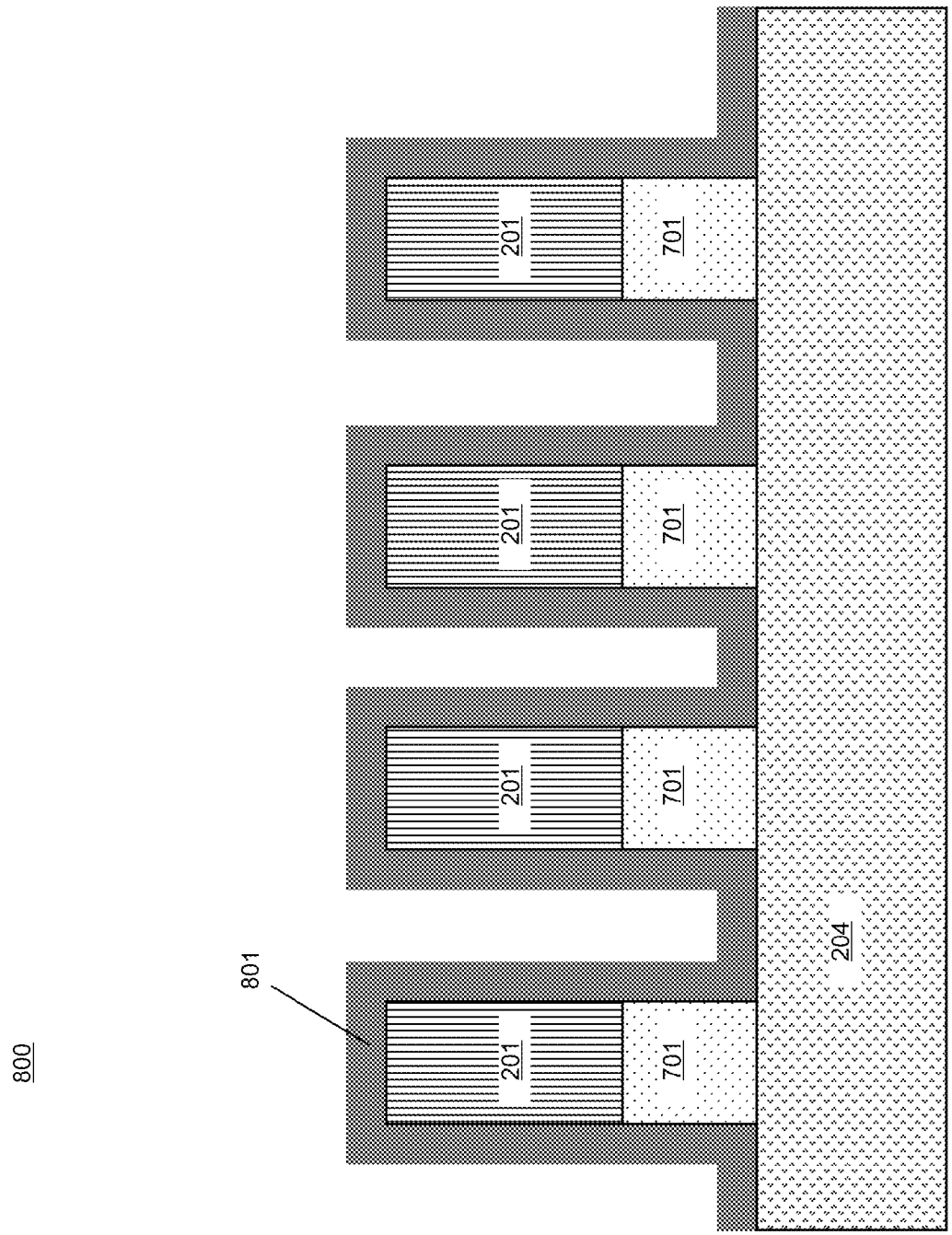
FIG. 8B illustrates a cross sectional view of the device of FIG. 7B after deposition of spacer material over the device.
Figure 9A:
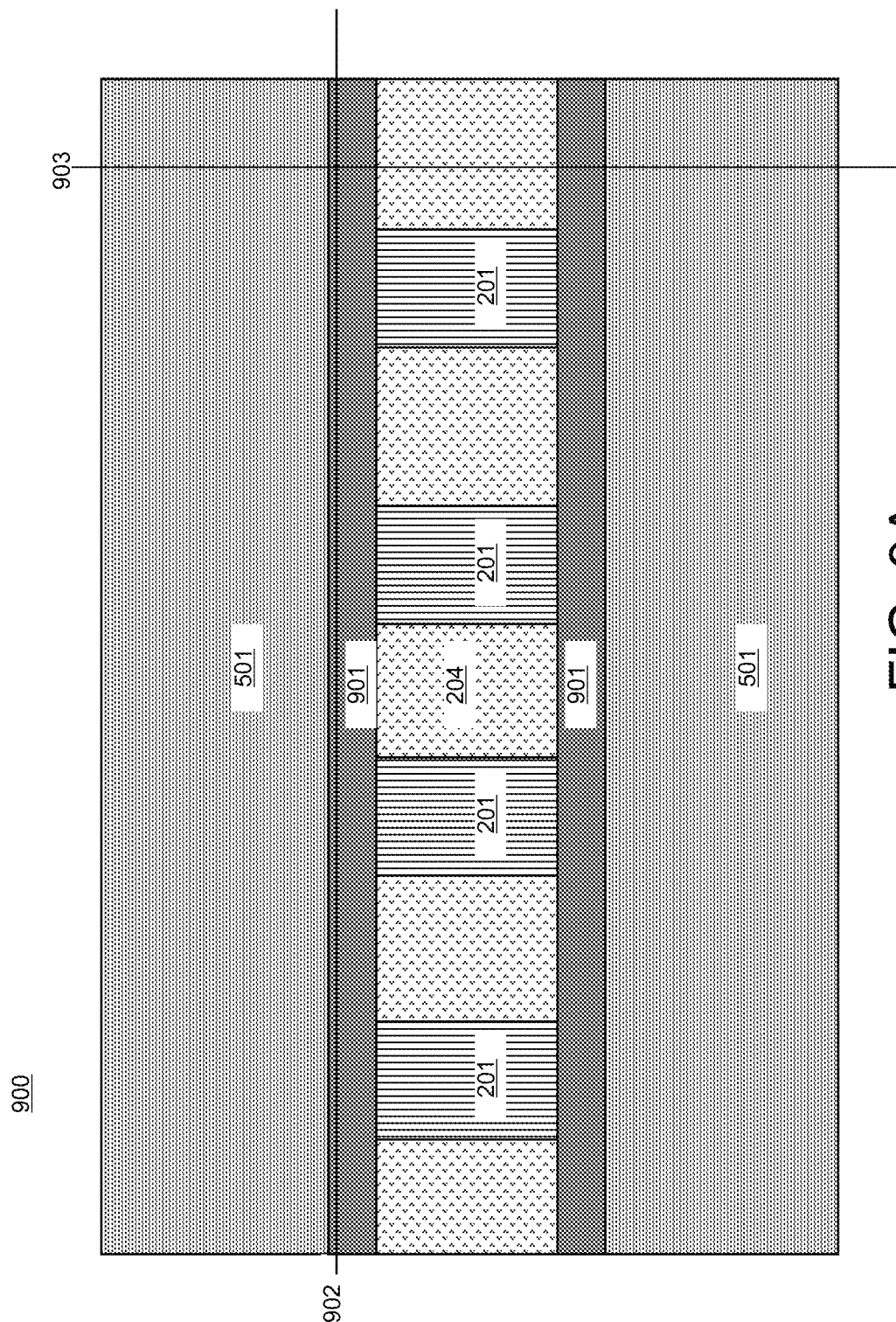
FIG. 9A illustrates a top view of the device of FIG. 8A after etching of the spacer material to form inner spacers over the fins adjacent to the oxide fill.
Figure 9B:
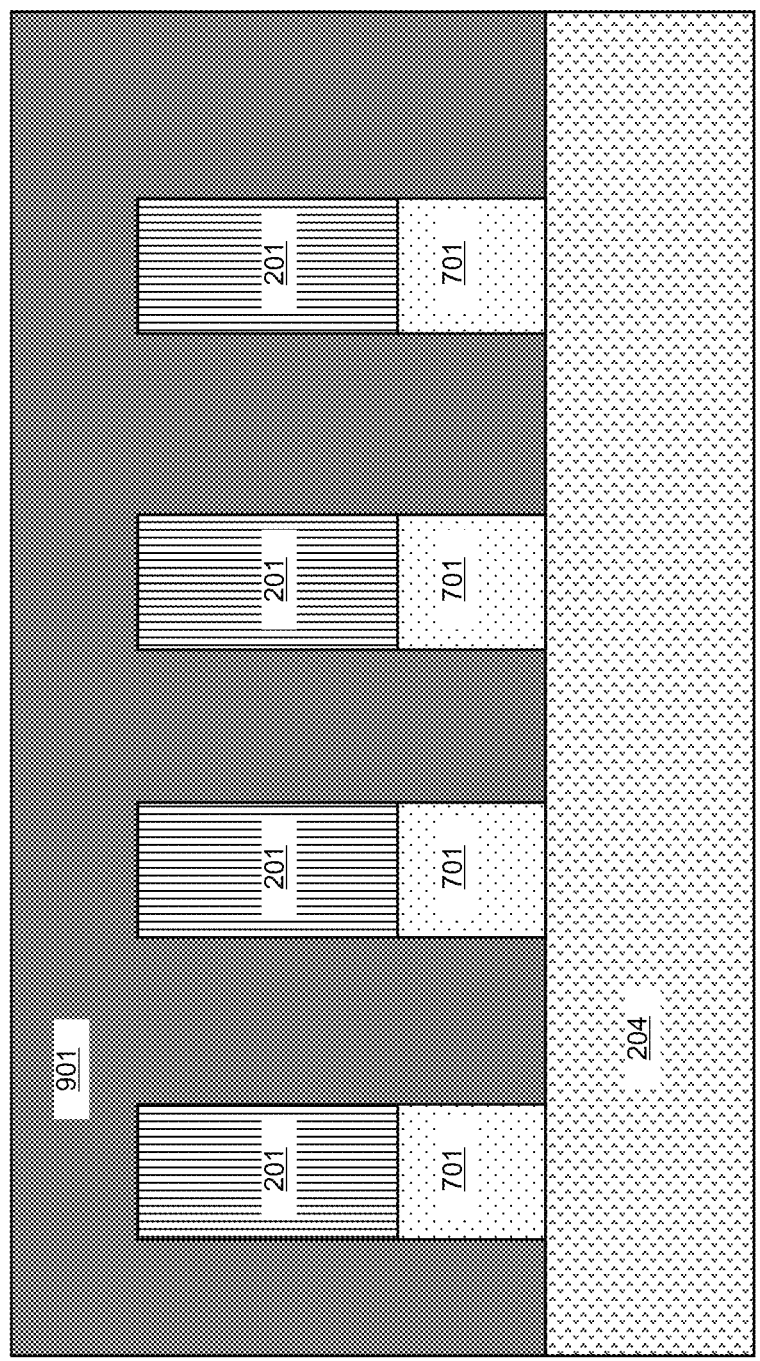
FIG. 9B illustrates a first cross sectional view of the device of FIG. 8B after etching of the spacer material to form inner spacers over the fins adjacent to the oxide fill.
Figure 9C:
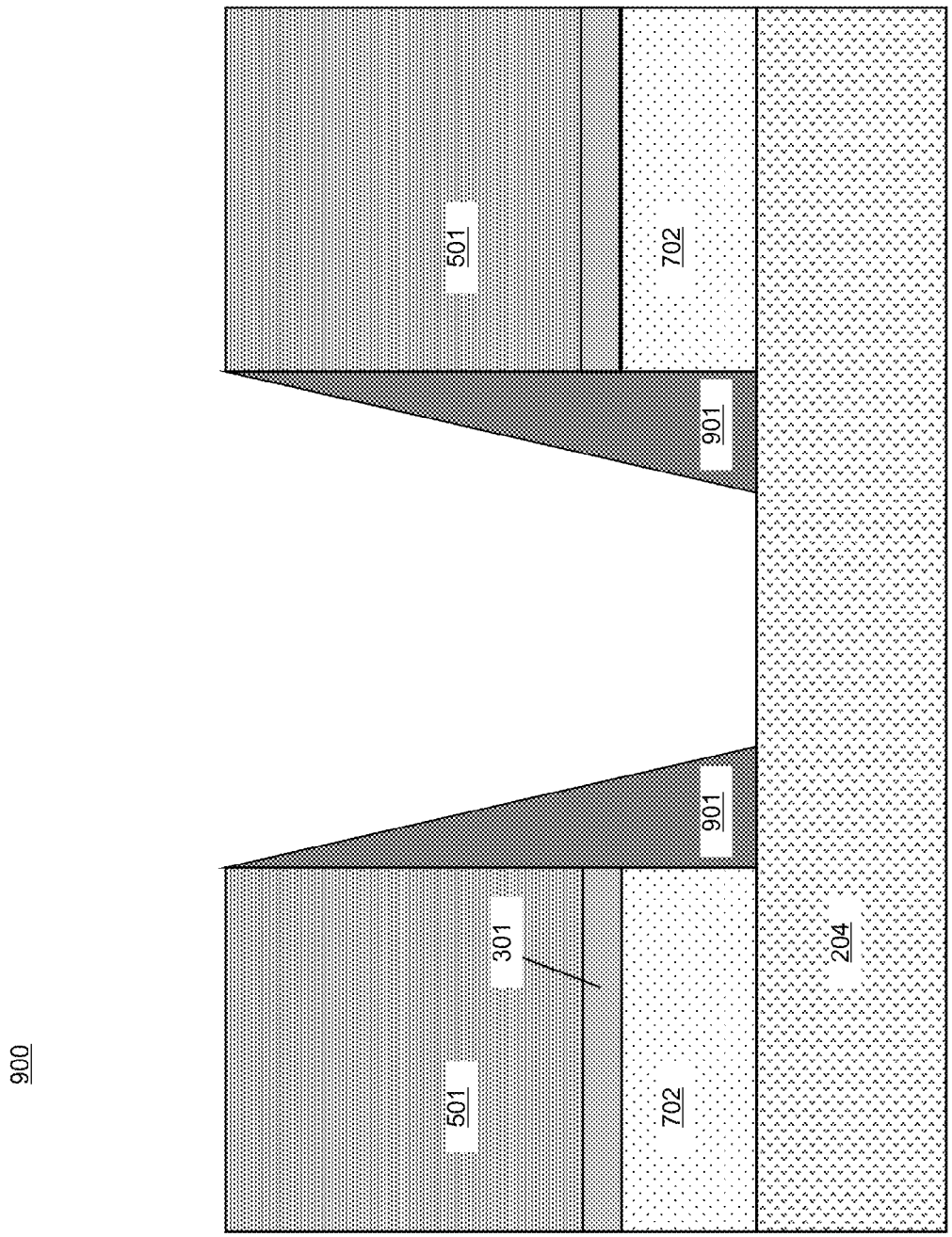
FIG. 9C illustrates a second cross sectional view of the device of FIG. 8B after etching of the spacer material to form inner spacers over the fins adjacent to the oxide fill.

Next, method 100 proceeds to block 107, in which inner spacers are formed over the fins adjacent to the oxide fill. The inner spacers are formed by depositing a spacer material over the device, and then etching the spacer material to form the inner spacers. The spacer material may comprise nitride. The etch of the spacer material may comprise RIE, and may be performed such that the spacer material is removed from the sides of taller structures more slowly that it is removed from shorter structures. Therefore, the spacer material that is located on the fins and patterned hardmask may be completely removed while the spacer material located on the sides of the oxide fill remains. The etch of the spacer material is timed such that the spacer material that comprises the inner spacers is not removed adjacent to the oxide fill, and over the portions of the fins that are located adjacent to the source/drain regions, after the etch. The inner spacers are located on top of the BOX in between the fins adjacent to the oxide fill, such that the portion of portions of the fins that are located adjacent to the source/drain regions are surrounded by the inner spacers on either side, and covered by the patterned hardmask on top. FIG. 8A illustrates a top view of the device 700 of FIG. 7A after deposition of spacer material 801 over the device 700, and FIG. 8B illustrates a cross section of the device 800 of FIG. 8A along line 802 that is shown in FIG. 8A. Spacer material 801 covers the oxide fill 501, the patterned hardmask 201, the fins 701, and the BOX 204. Spacer material 801 may comprise nitride. FIG. 9A illustrates a top view of the device 800 of FIG. 8A after etching of the spacer material 801 to form inner spacers 901 adjacent to the oxide fill 501; FIG. 9B illustrates a cross section of the device 900 of FIG. 9A along line 902 that is shown in FIG. 9A; and FIG. 9C illustrates a cross section of the device 900 of FIG. 9A along line 903 that is shown in FIG. 9A. The inner spacers 901 are located on top of the BOX 204 in between the fins 701, and extend up the sides of oxide fill 501 from the BOX 204. The inner spacers 901 are wider at the bottom, adjacent to the BOX 204, that at the top, as the spacer material 801 is removed from the top down during the spacer formation etch that is performed in block 107. The inner spacers 901 surround the portions of the fins 701 that are located adjacent to the source/drain regions 702, protecting the surrounded portions of the fins 701 during subsequent processing. The inner spacers 901 also protect the source/drain regions 702 during subsequent processing.

Figure 10A:
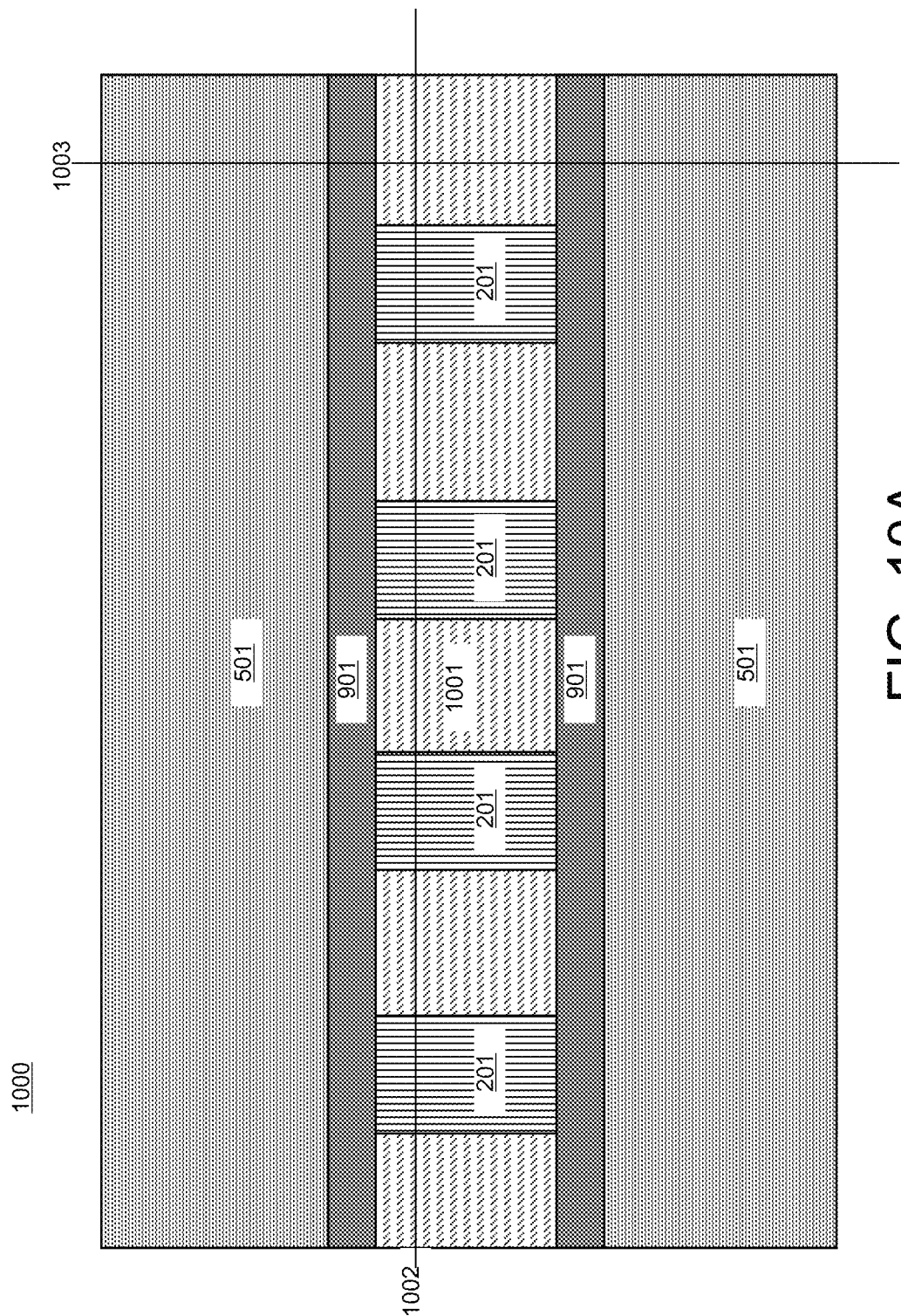
FIG. 10A illustrates a top view of the device of FIG. 9A after growth of silicon germanium between the fins.
Figure 10B:
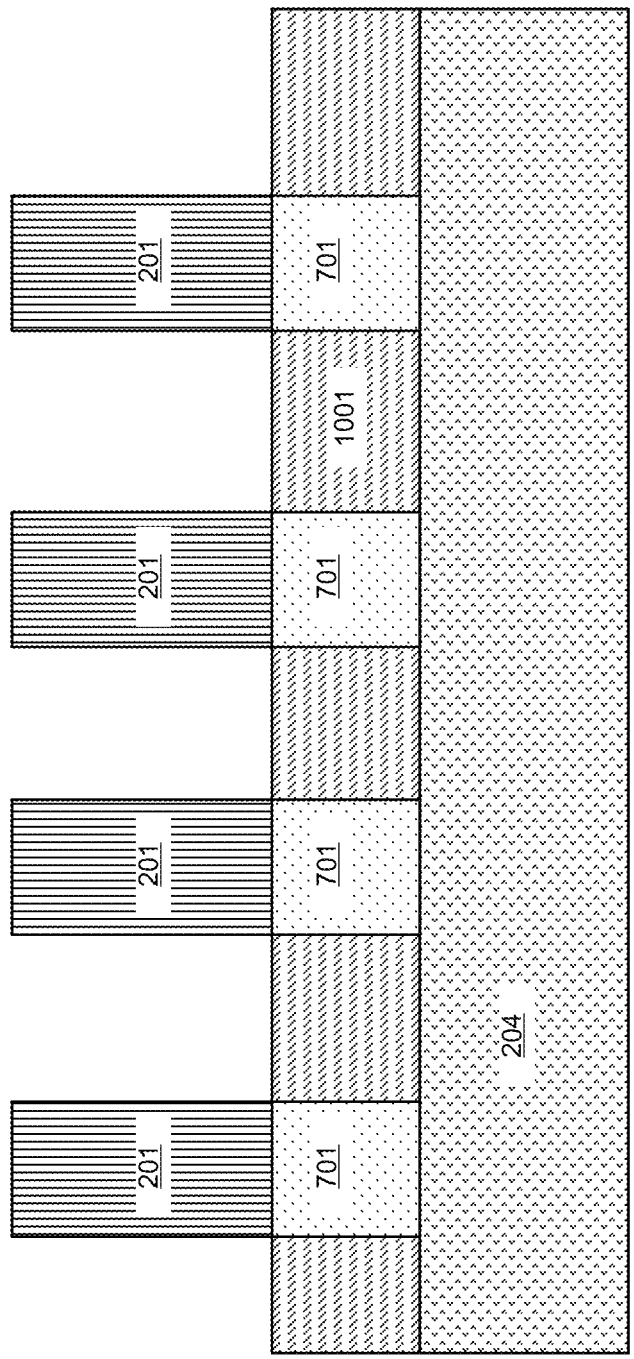
FIG. 10B illustrates a first cross sectional view of the device of FIG. 9B after growth of silicon germanium between the fins.
Figure 10C:
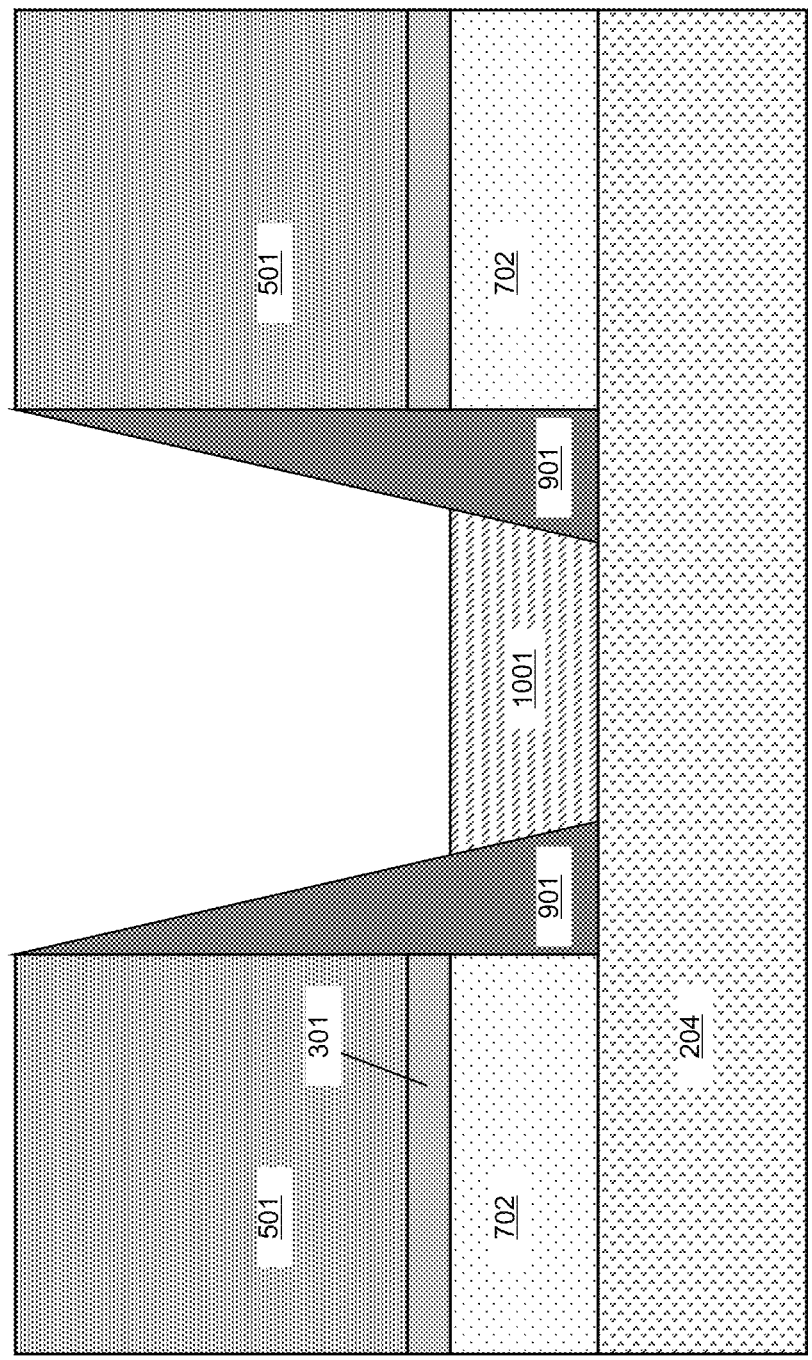
FIG. 10C illustrates a second cross sectional view of the device of FIG. 9C after growth of silicon germanium between the fins.

Next, method 100 proceeds to block 108, in which SiGe is formed on the exposed BOX regions in between the fins. The SiGe may be formed in any appropriate manner. The SiGe is located adjacent to the portions of the fins that are not protected by the inner spacers. FIG. 10A illustrates a top view of the device 900 of FIG. 9A after formation of SiGe 1001; FIG. 10B illustrates a cross section of the device 1000 of FIG. 10A along line 1002 that is shown in FIG. 10A; and FIG. 10C illustrates a cross section of the device 1000 of FIG. 10A along line 1003 that is shown in FIG. 10A. SiGe 1001 is located in between fins 701 and on top of the exposed portions of BOX 204. The inner spacers 901 are located in between the SiGe 1001 and the portions of the fins 701 adjacent to source/drain regions 702. The inner spacers 901 are also located in between the SiGe 1001 and the source/drain regions 702.

Figure 11A:
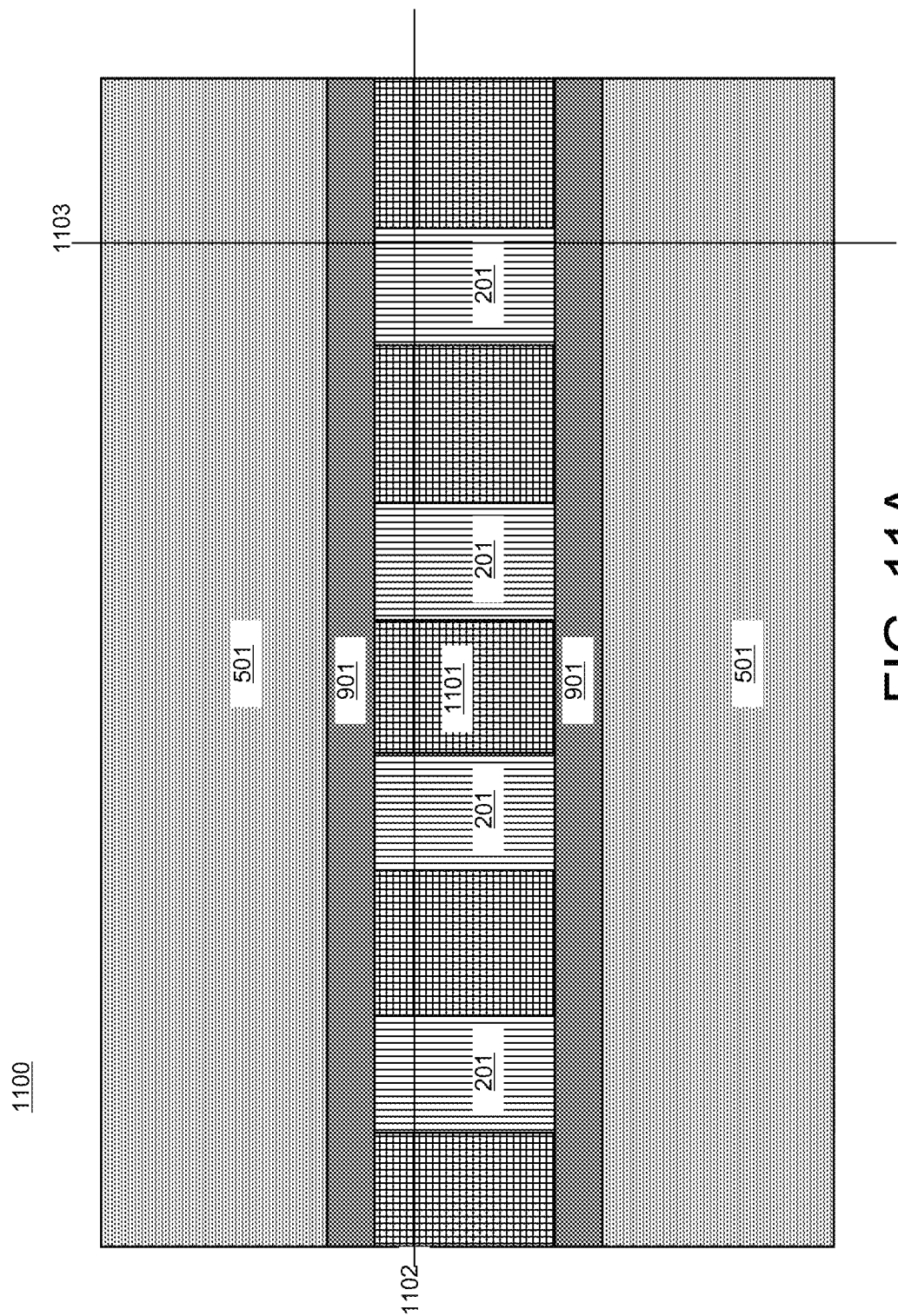
FIG. 11A illustrates a top view of the device of FIG. 10A after oxidation of the silicon germanium and conversion of portions the fins that are not surrounded by the spacers to silicon germanium.
Figure 11B:
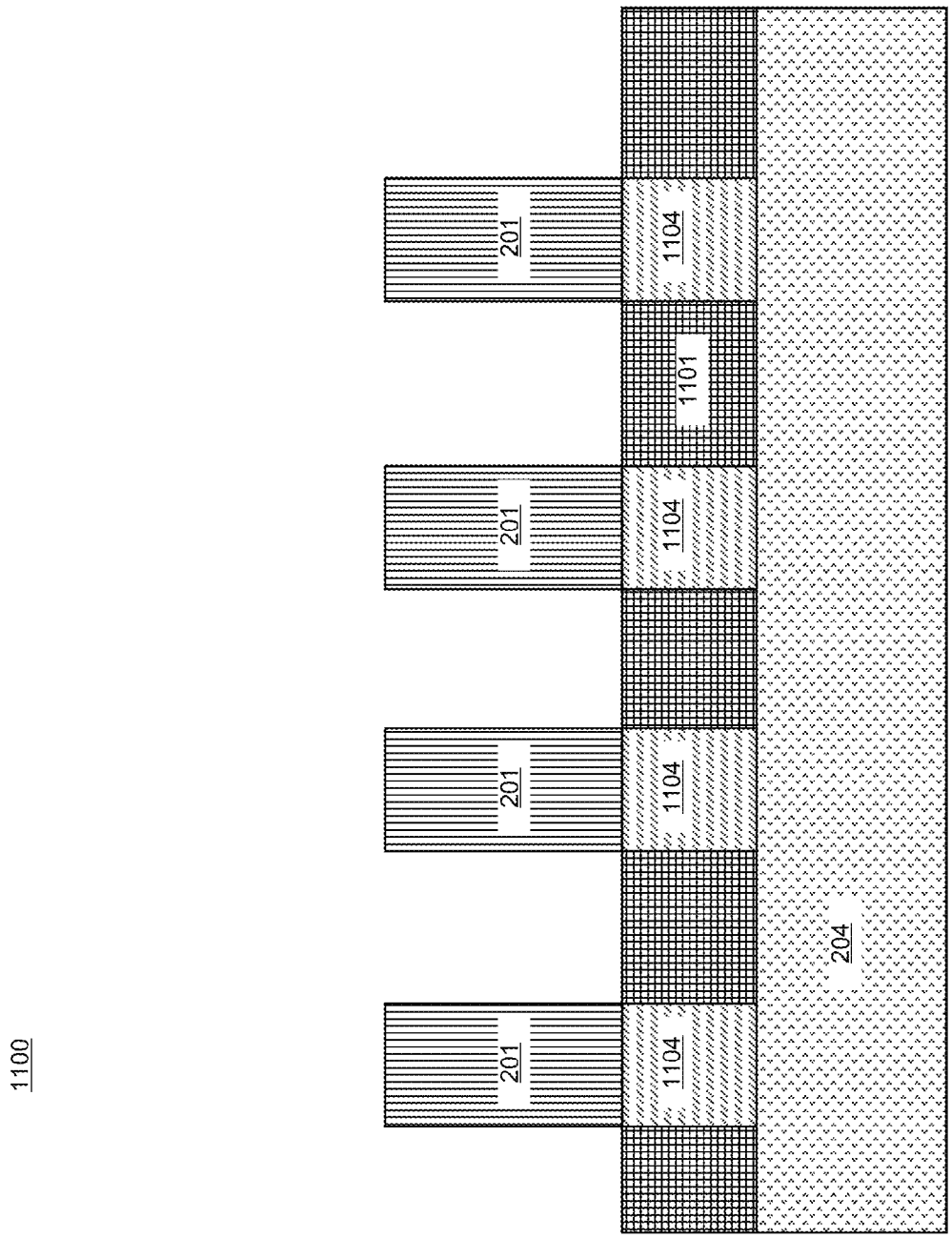
FIG. 11B illustrates a first cross sectional view of the device of FIG. 10B after oxidation of the silicon germanium and conversion of portions the fins that are not surrounded by the spacers to silicon germanium.
Figure 11C:
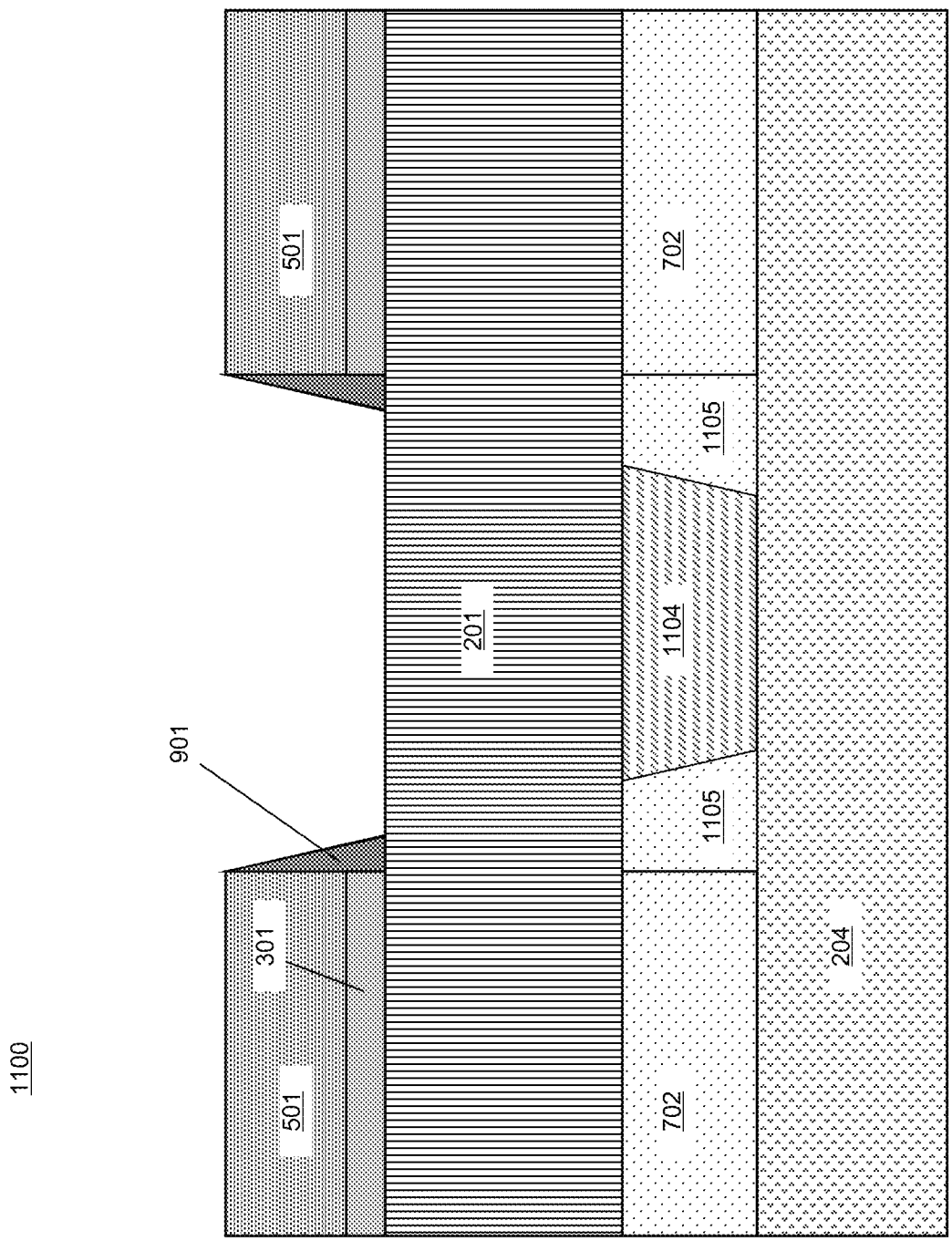
FIG. 11C illustrates a second cross sectional view of the device of FIG. 10C after oxidation of the silicon germanium and conversion of portions the fins that are not surrounded by the spacers to silicon germanium.

Returning to FIG. 1, method 100 proceeds to block 109, in which the SiGe is oxidized. Because SiGe oxidizes relatively quickly as compared to silicon, the SiGe may be fully converted to oxide. The oxidation of the SiGe causes the germanium in the SiGe to be driven into the portions of the silicon fins that are located adjacent to the SiGe by germanium condensation, forming SiGe channel regions in the fins. The portions of the fins that are protected by the inner spacers are not converted to SiGe during the oxidation that is performed during block 109, and form silicon buffer regions between the SiGe channel regions and the source/drain regions in the final finFET device. FIG. 11A illustrates a top view of the device 1000 of FIG. 10A after oxidation of the SiGe 1001 to form oxidized SiGe 1101; FIG. 11B illustrates a cross section of the device 1100 of FIG. 11A along line 1102 that is shown in FIG. 11A; and FIG. 11C illustrates a cross section of the device 1100 of FIG. 11A along line 1103 that is shown in FIG. 11A. Formation of oxidized SiGe 1101 converts portions of the fins 701 that were located adjacent to SiGe 1001 into SiGe channel regions 1104, due to germanium condensation. Portions of the fins 701 that are protected on either side by the inner spacers 901 and on the top by the patterned hardmask 201 (as was shown in FIG. 9B) during the formation of oxidized SiGe 1101 are not converted into SiGe, and become silicon buffer regions 1105, located adjacent to the source/drain regions 702. The shape of the silicon buffer regions 1105 is determined by the shape of the inner spacers 901. The inner spacers 901 also protect the source/drain regions 702 during formation of oxidized SiGe 1101 and SiGe channel regions 1104.

Figure 12A:
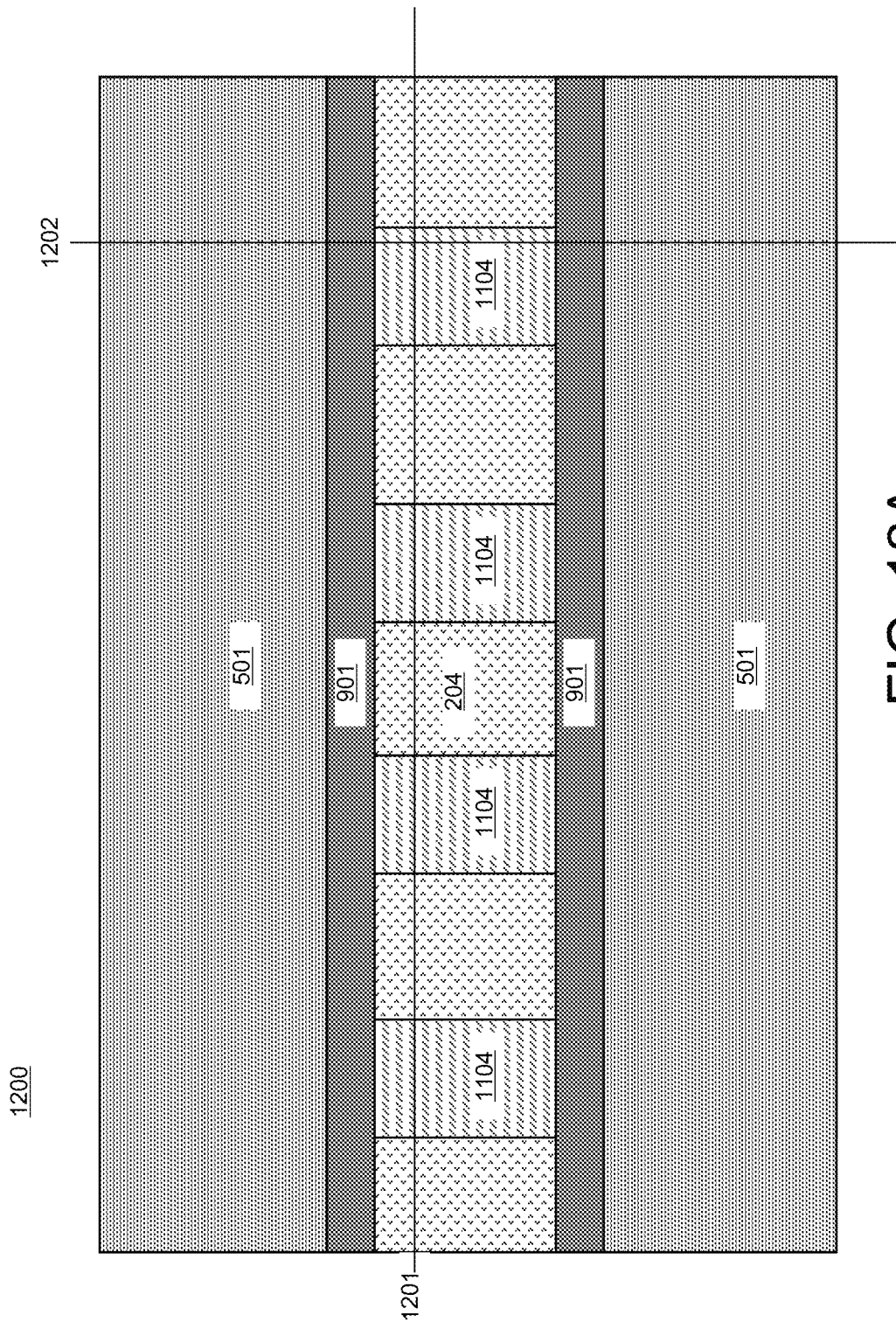
FIG. 12A illustrates a top view of the device of FIG. 11A after removal of the oxidized silicon germanium and the patterned hardmask.
Figure 12B:
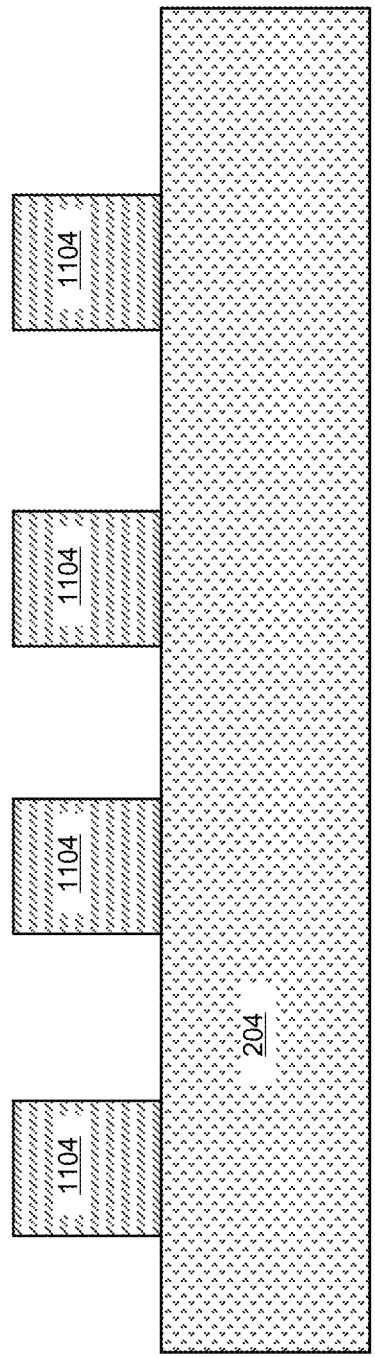
FIG. 12B illustrates a first cross sectional view of the device of FIG. 11B after removal of the oxidized silicon germanium and the patterned hardmask.
Figure 12C:
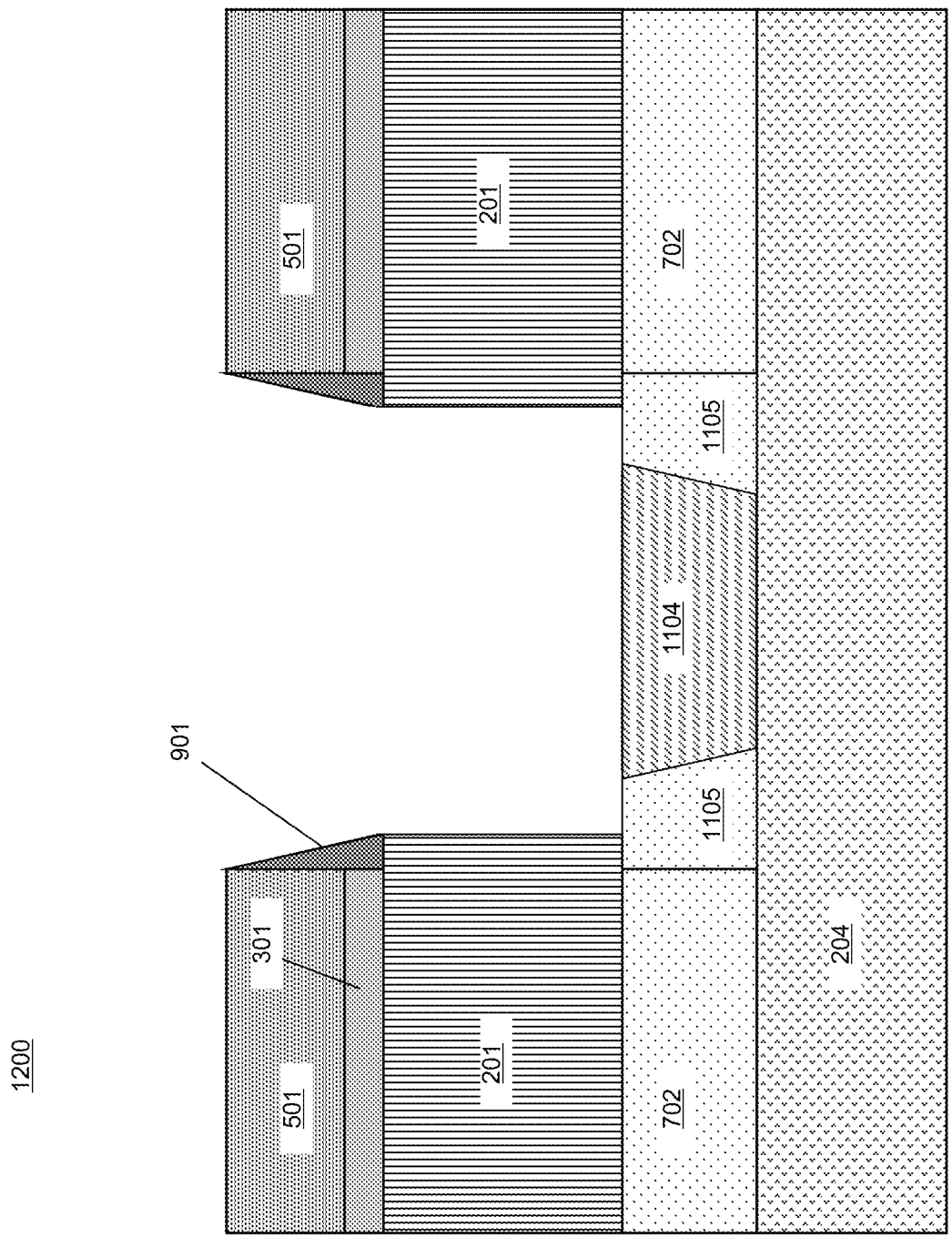
FIG. 12C illustrates a second cross sectional view of the device of FIG. 11C after removal of the oxidized silicon germanium and the patterned hardmask.

Next, method 100 proceeds to block 110, in which the oxidized SiGe and the patterned hardmask are removed from the SiGe channel regions. The oxidized SiGe and the patterned hardmask may be removed in any appropriate manner; as the oxidized SiGe and the patterned hardmask both comprise oxide, such that a single etch may be required during block 110 of FIG. 1. Portions of the oxide fill may also be removed during the removal of the oxidized SiGe and the patterned hardmask; however, because the oxide fill has relatively large height as compared to the oxidized SiGe and the patterned hardmask, a relatively large portion of the oxide fill may remain on the source/drain regions of the device after the removal of the oxidized SiGe and patterned hardmask. FIG. 12A illustrates a top view of the device 1100 of FIG. 11A after removal of the oxidized SiGe 1101 and patterned hardmask 201; FIG. 12B illustrates a cross section of the device 1200 of FIG. 12A along line 1201 that is shown in FIG. 12A; and FIG. 12C illustrates a cross section of the device 1200 of FIG. 12A along line 1202 that is shown in FIG. 12A. Oxidized SiGe 1101 and patterned hardmask 201 have been removed, exposing SiGe channel regions 1104 and silicon buffer regions 1105. Portions of oxide fill 501 may also be removed during block 110 of FIG. 1.

Figure 13A:
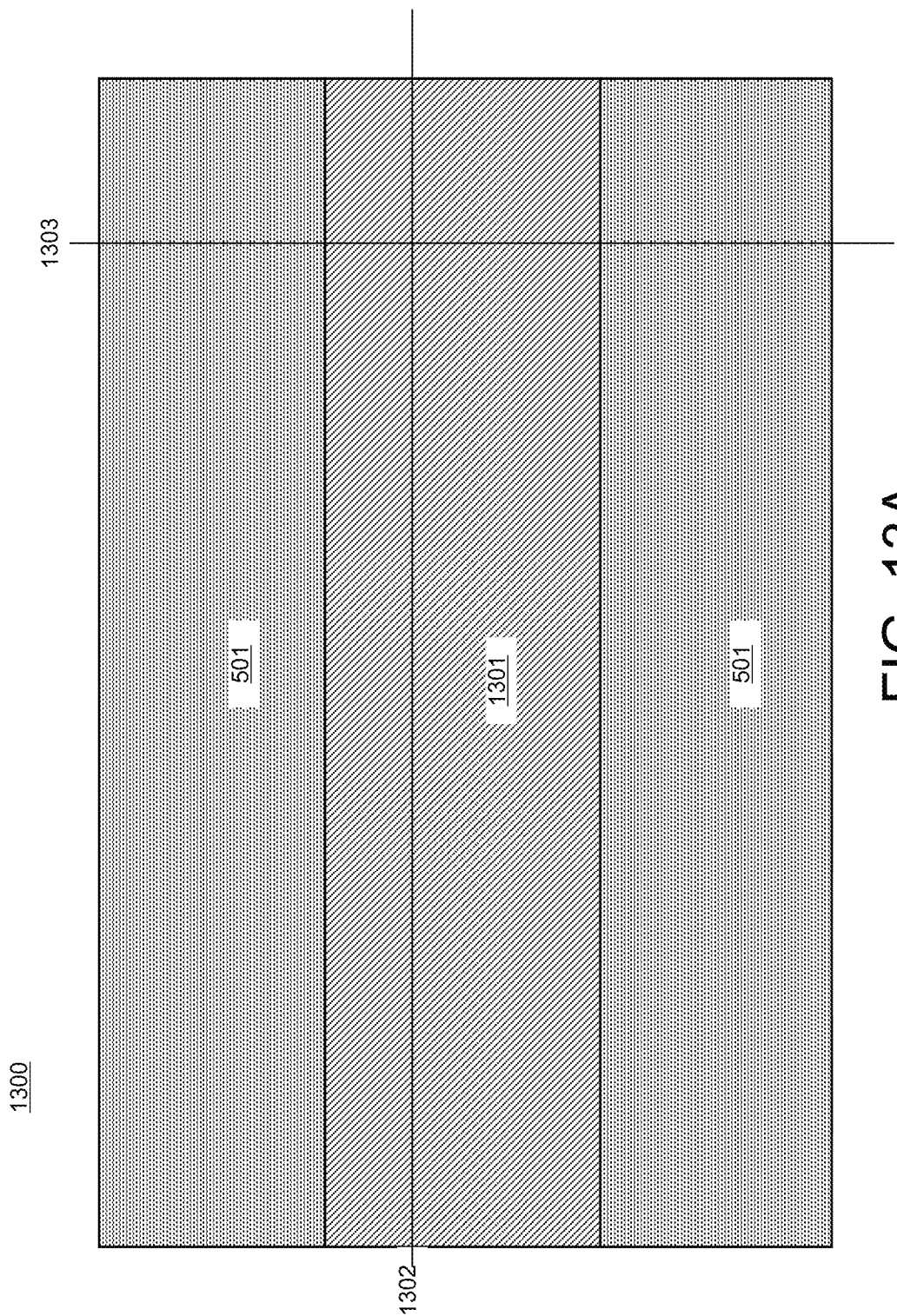
FIG. 13A illustrates a top view of the device of FIG. 12A after gate formation.
Figure 13B:
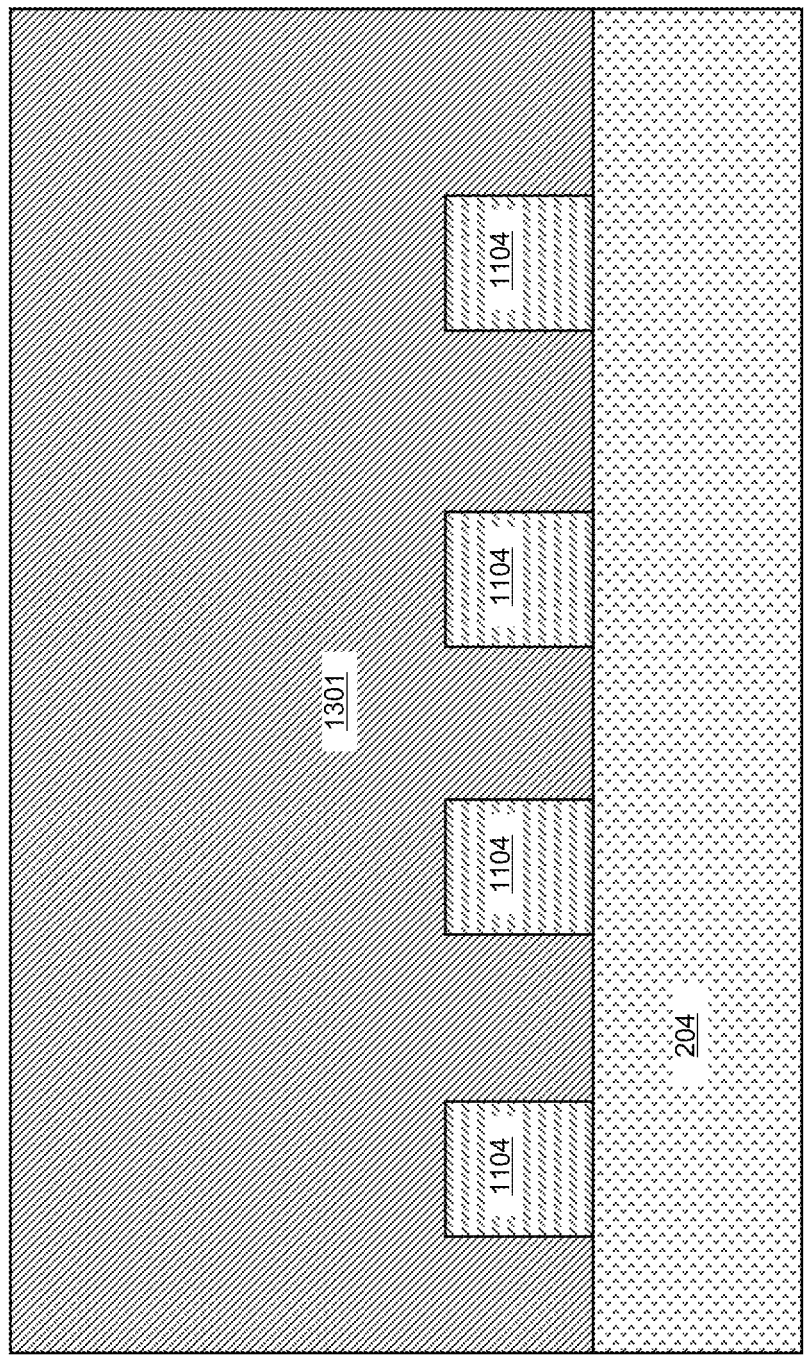
FIG. 13B illustrates a first cross sectional view of the device of FIG. 12B after gate formation.
Figure 13C:
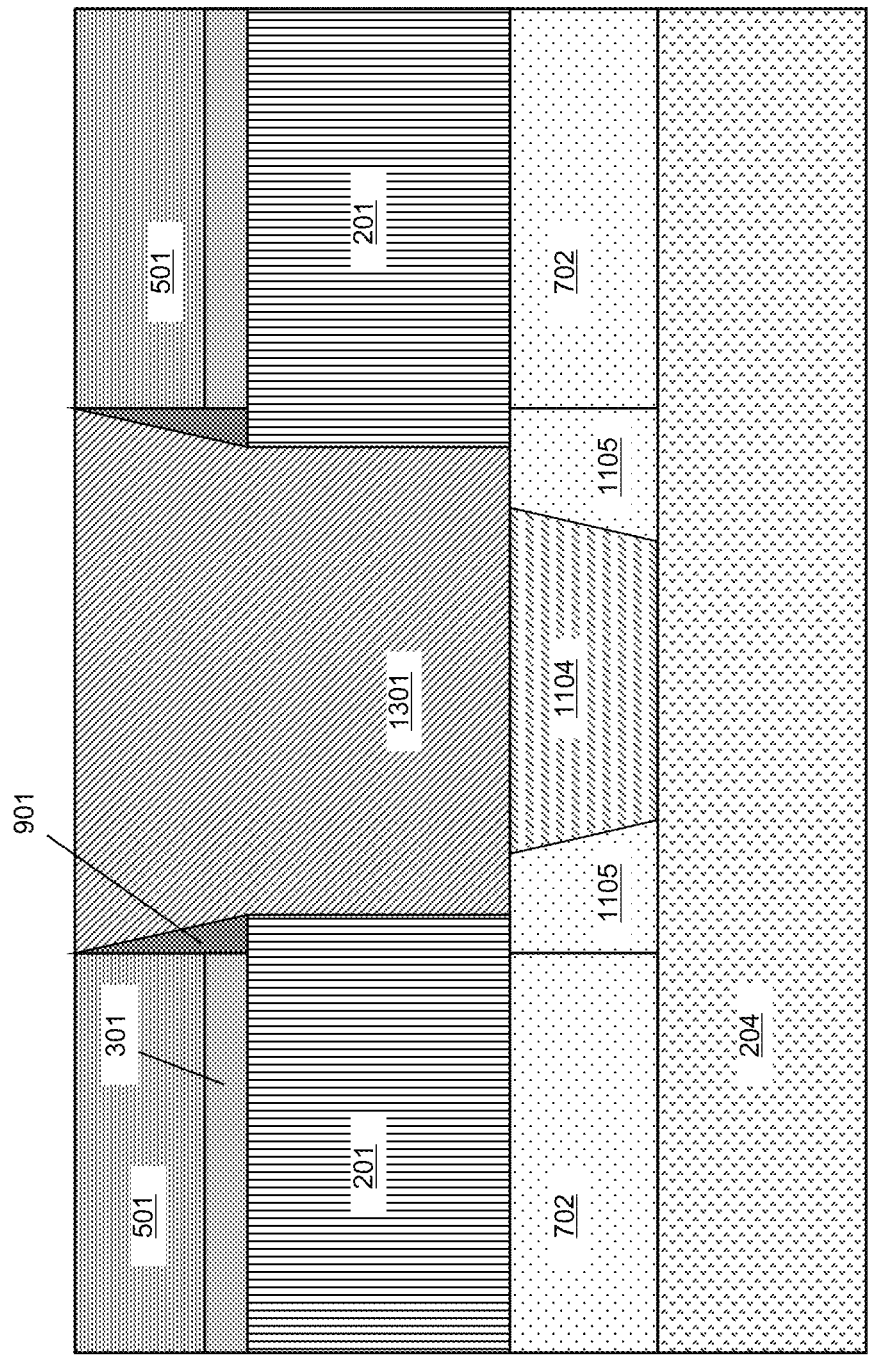
FIG. 13C illustrates a second cross sectional view of the device of FIG. 12C after gate formation.

Next, in block 111 of method 100 of FIG. 1, the final gate is formed over the fins in between the remaining oxide fill regions. The final gate may comprise any appropriate gate stack, including but not limited to a high-k-metal gate, with a top layer of polysilicon. The final gate may be formed over the fins in any appropriate manner. FIG. 13A illustrates a top view of the device 1200 of FIG. 12A after formation of gate 1301; FIG. 13B illustrates a cross section of the device 1300 of FIG. 13A along line 1302 that is shown in FIG. 13A; and FIG. 13C illustrates a cross section of the device 1300 of FIG. 13A along line 1303 that is shown in FIG. 13A. Gate 1301 is formed on top of the exposed SiGe channel regions 1104 and silicon buffer regions 1105 in between the oxide fill 501. Gate 1301 also covers the inner spacers 901 and the BOX 204 in between the SiGe channel regions 1104.

Figure 14B:
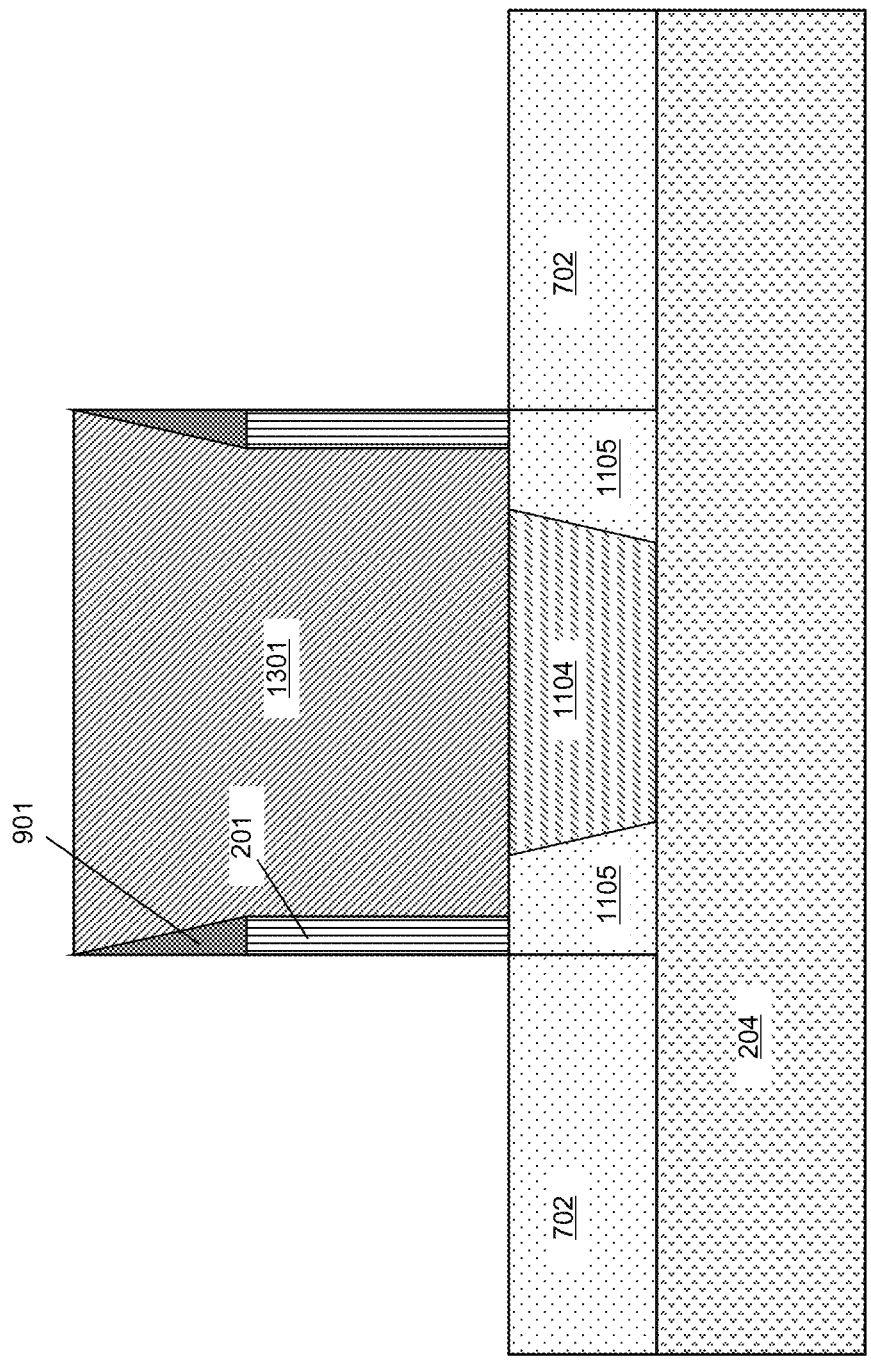
FIG. 14B illustrates a first cross sectional view of the device of FIG. 13B after removal of the oxide fill to expose the source/drain regions.
Figure 14C:
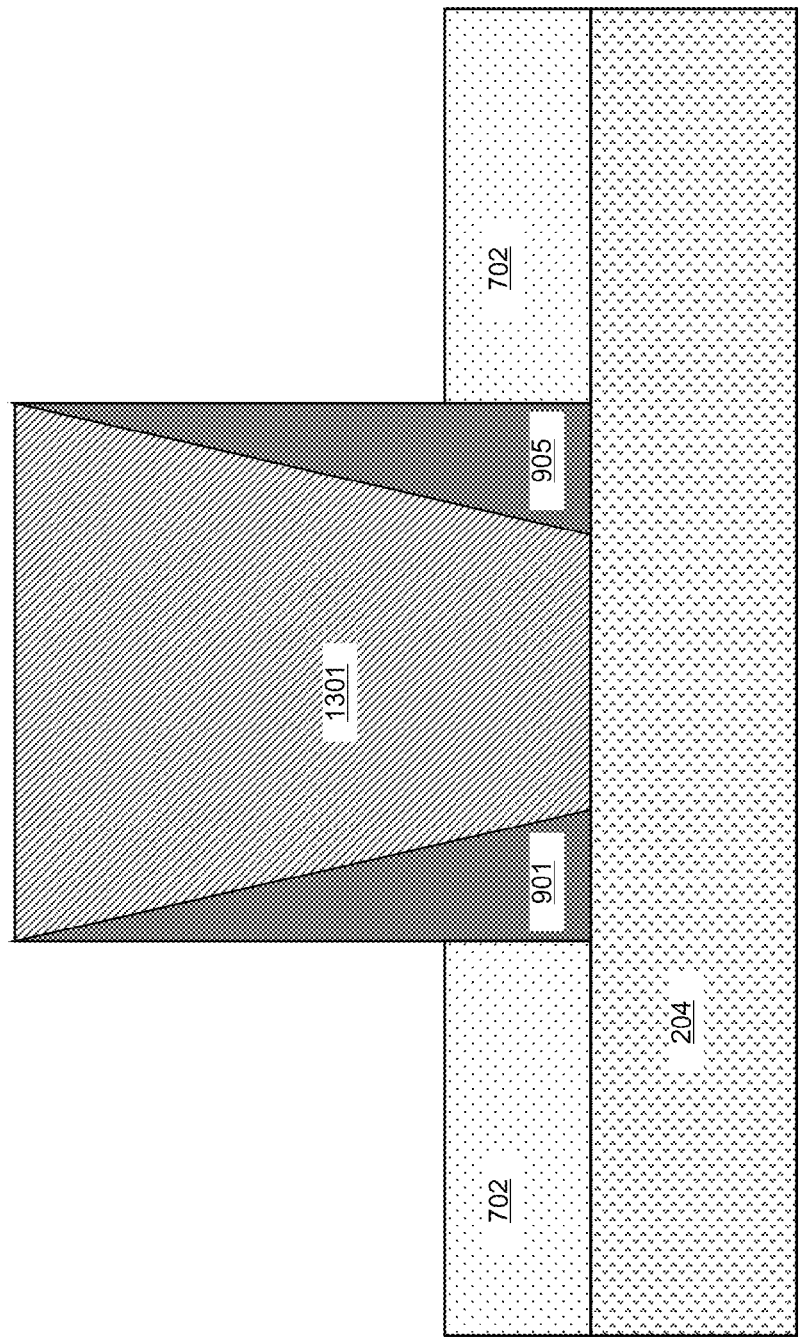
FIG. 14C illustrates a second cross sectional view of the device of FIG. 13C after removal of the oxide fill to expose the source/drain regions.

Lastly, in block 112 of method 100 of FIG. 1, the oxide fill is removed, exposing the source/drain regions for contact formation. The resulting device comprises a finFET device having SiGe channel regions, with silicon buffer regions located on either side of the SiGe channel regions adjacent to the source/drain regions. The oxide fill may be removed in any appropriate manner. The remaining blanket oxide and patterned hardmask that are located underneath the oxide fill are also removed during removal of the oxide fill. FIG. 14A illustrates a top view of the device 1300 of FIG. 13A after removal of the oxide fill 501 and blanket oxide 301; FIG. 14B illustrates a cross section of the device 1400 of FIG. 14A along line 1401 that is shown in FIG. 14A; and FIG. 14C illustrates a cross section of the device 1400 of FIG. 14A along line 1402 that is shown in FIG. 14A. Device 1400 comprises a finFET device having SiGe channel regions 1104 and silicon buffer regions 1105. Removal of the oxide fill 501 and blanket oxide 301 exposes source/drain regions 702 for contact formation. The SiGe channel regions 1104 are separated from the source/drain regions 702 by silicon buffer regions 1105, which reduces the leakage current in the finFET device 1400.

The technical effects and benefits of exemplary embodiments include formation of a finFET device having a reduced leakage current.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a fin field effect transistor (finFET) device, comprising:
   forming a silicon fin on a substrate;
   forming an inner spacer adjacent to a first portion of the silicon fin;
   forming silicon germanium regions adjacent to a second portion of the silicon fin and the inner spacer; and
   oxidizing the silicon germanium regions, such that the second portion of the silicon fin that is located adjacent to the silicon germanium regions is converted to a silicon germanium channel region during oxidizing of the silicon germanium regions, and such that the first portion of the silicon fin is protected by the inner spacer during oxidation of the silicon germanium regions, wherein the first portion of the silicon fin comprises a silicon buffer region located between the silicon germanium channel region and a source/drain region of the finFET device.

2. The method of claim 1, wherein forming the silicon fin on the substrate comprises:
   forming a hardmask on the substrate;
   patterning the hardmask to define a location of the silicon fin;
   forming a dummy gate over the substrate and a first portion of the patterned hardmask;
   forming an oxide fill over the substrate and a second portion of the patterned hardmask adjacent to the dummy gate;
   removing the dummy gate; and
   etching a portion of the substrate that was located underneath the dummy gate to form the silicon fin using the first portion of the patterned hardmask as a mask.

3. The method of claim 2, wherein the hardmask comprises oxide.

4. The method of claim 2, wherein the substrate comprises a silicon-on-insulator substrate comprising a top silicon layer on top of a buried oxide (BOX) layer, and wherein silicon fin is formed in the top silicon layer on top of the BOX layer.

5. The method of claim 4, wherein the silicon germanium regions are located on the BOX layer adjacent to the silicon fin.

6. The method of claim 4, wherein a portion of the top silicon layer that is located underneath the oxide fill comprises the source/drain region of the finFET device.

7. The method of claim 2, wherein forming the inner spacer adjacent to the first portion of the silicon fin comprises:
   depositing a spacer material over the oxide fill and the silicon fin;
   etching the spacer material to form the inner spacer adjacent to the oxide fill, such that the sides of the first portion of the silicon fin are covered by the inner spacer, and the top of the first portion of the silicon fin is covered by the hardmask on top during oxidation of the silicon germanium regions.

8. The method of claim 7, wherein the spacer material comprises nitride.

9. The method of claim 2, further comprising removing the oxidized silicon germanium regions and the first portion of the patterned hardmask after oxidizing the silicon germanium regions.

10. The method of claim 9, wherein the oxidized silicon germanium regions and the first portion of the patterned hardmask are removed simultaneously.

11. The method of claim 9, further comprising forming a final gate over the second portion of the silicon fin after removing the oxidized silicon germanium regions and the first portion of the patterned hardmask, wherein the final gate is located adjacent to the inner spacer.

12. The method of claim 11, further comprising removing the oxide fill and the second portion of the patterned hardmask to expose the source/drain region after forming the final gate.

13. The method of claim 12, wherein the oxide fill and the second portion of the patterned hardmask are removed simultaneously.

14. The method of claim 1, wherein the inner spacer is also formed adjacent to the source/drain region, and protects the source/drain region during oxidation of the silicon germanium regions.

* * * * *